(12) United States Patent
Shang et al.

(10) Patent No.: US 12,238,997 B2
(45) Date of Patent: Feb. 25, 2025

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Tinghua Shang, Beijing (CN); Yi Zhang, Beijing (CN); Tingliang Liu, Beijing (CN); Yang Zhou, Beijing (CN); Linhong Han, Beijing (CN); Pengfei Yu, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 692 days.

(21) Appl. No.: 17/435,221

(22) PCT Filed: Mar. 19, 2020

(86) PCT No.: PCT/CN2020/080239
§ 371 (c)(1),
(2) Date: Aug. 31, 2021

(87) PCT Pub. No.: WO2021/184306
PCT Pub. Date: Sep. 23, 2021

(65) Prior Publication Data
US 2022/0328570 A1  Oct. 13, 2022

(51) Int. Cl.
*H10K 59/35* (2023.01)
*H10K 59/121* (2023.01)
*H10K 59/131* (2023.01)

(52) U.S. Cl.
CPC ....... *H10K 59/353* (2023.02); *H10K 59/1213* (2023.02); *H10K 59/1216* (2023.02); *H10K 59/131* (2023.02)

(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS 10,720,481 B2   7/2020  Xiao et al.
2007/0153196 A1*  7/2007  Jang ..................... G09G 3/3648
                                                    349/141
(Continued)

FOREIGN PATENT DOCUMENTS

CN   207781608 U   8/2018
CN   208077981 U   11/2018
(Continued)

OTHER PUBLICATIONS

U.S. Office Action in U.S. Appl. No. 17/598,555 dated Mar. 4, 2024.
(Continued)

*Primary Examiner* — Monica D Harrison
*Assistant Examiner* — Andre C Stevenson
(74) *Attorney, Agent, or Firm* — Collard & Roe, P.C.

(57) ABSTRACT

A display substrate and a display device are provided. The display substrate includes repeating units, each repeating unit includes one first color sub-pixel, one second color sub-pixel pair and one third color sub-pixel, the second color sub-pixel pair includes two second color sub-pixels. In each repeating unit, a distance, along the first direction, between a center of the third color sub-pixel and a center of the second color sub-pixel pair is a first distance; two adjacent repeating units located in a same repeating unit group include a first repeating unit and a second repeating unit, a
(Continued)

distance between a center of a second color sub-pixel pair in a third repeating unit adjacent to both the first repeating unit and the second repeating unit and a center of a third color sub-pixel in the first repeating unit is a second distance, and the first distance is different from the second distance.

20 Claims, 13 Drawing Sheets

(58) Field of Classification Search
CPC ....... H01L 2933/0041; H01L 2933/005; G02F 1/1335; B32B 2457/206
See application file for complete search history.

(56) References Cited

U.S. PATENT DOCUMENTS

| | | |
|---|---|---|
| 2016/0322442 A1 | 11/2016 | Lee et al. |
| 2016/0329391 A1 | 11/2016 | Ko et al. |
| 2018/0076270 A1 | 3/2018 | Kwon et al. |
| 2018/0342570 A1 | 11/2018 | Hong et al. |
| 2020/0043990 A1 | 2/2020 | Huanggu et al. |
| 2020/0168594 A1* | 5/2020 | Choi ............... H01L 25/167 |
| 2020/0168692 A1* | 5/2020 | Liu ................ H10K 59/179 |
| 2022/0399417 A1 | 12/2022 | Mou et al. |

FOREIGN PATENT DOCUMENTS

| | | |
|---|---|---|
| CN | 108933155 A | 12/2018 |
| CN | 109427854 A | 3/2019 |
| CN | 109786434 A | 5/2019 |
| EP | 3 229 223 A1 | 10/2017 |
| EP | 3 407 389 A1 | 11/2018 |
| EP | 4 006 985 A1 | 6/2022 |

OTHER PUBLICATIONS

International Search Report of PCT/CN2020/080239 in Chinese, mailed Dec. 23, 2020 with English translation.
Notice of Transmittal of the International Search Report of PCT/CN2020/080239 in Chinese, mailed Dec. 23, 2020.
Written Opinion of the International Searching Authority of PCT/CN2020/080239 in Chinese, mailed Dec. 23, 2020.
Written Opinion of the International Searching Authority of PCT/CN2020/080239, mailed Dec. 23, 2020 in English.
Extended European Search Report in European Application No. 20925503.3 dated Apr. 5, 2023.
Extended European Search Report in European Application No. 20925636.1 dated Apr. 13, 2023.
U.S. Office Action in U.S. Appl. No. 17/598,555 dated Jun. 7, 2024.
Chinese Office Action in Chinese Application No. 202080000310.7 dated Nov. 25, 2024 with English translation.

* cited by examiner

DISPLAY SUBSTRATE AND DISPLAY DEVICE

CROSS REFERENCE TO RELATED APPLICATIONS

This application is the National Stage of PCT/CN2020/080239 filed on Mar. 19, 2020, the disclosure of which is incorporated by reference.

TECHNICAL FIELD

At least one embodiment of the present disclosure relates to a display substrate and a display device.

BACKGROUND

With the development of organic light emitting diode display technology, such as active matrix organic light emitting diode (AMOLED) display technology, people have higher and higher requirements for display effect. Performance specifications of organic light emitting diode display products can include power consumption, brightness, color cast, etc. The influence factors of the back plate included in the organic light emitting diode display product on the color cast can include the flatness of the anode.

SUMMARY

The embodiments of the present disclosure provide a display substrate and a display device.

At least one embodiment of the present disclosure provides a display substrate, including: a base substrate; a plurality of repeating units on the base substrate, each of the plurality of repeating units including one first color sub-pixel, one second color sub-pixel pair and one third color sub-pixel which are sequentially arranged along a first direction, the second color sub-pixel pair including two second color sub-pixels which are arranged along a second direction, the plurality of repeating units being arranged along the first direction to form a plurality of repeating unit groups, the plurality of repeating unit groups being arranged along the second direction, and adjacent repeating unit groups among the plurality of repeating unit groups being shifted from each other along the first direction. In each of the plurality of repeating units, a distance, along the first direction, between a center of the third color sub-pixel and a center of the second color sub-pixel pair is a first distance; two adjacent repeating units located in a same repeating unit group include a first repeating unit and a second repeating unit, the third color sub-pixel of the first repeating unit is adjacent to the first color sub-pixel of the second repeating unit, a repeating unit adjacent to both the first repeating unit and the second repeating unit and located in an adjacent repeating unit group is a third repeating unit, a distance, along the first direction, between a center of the third color sub-pixel in the first repeating unit and a center of the second color sub-pixel pair in the third repeating unit is a second distance, and the first distance is different from the second distance.

In some examples, the first distance is greater than the second distance.

In some examples, a ratio of the first distance to the second distance is in a range from 1.5 to 2.3.

In some examples, a distance, along the first direction, between a center of the first color sub-pixel in the second repeating unit and the center of the second color sub-pixel pair in the third repeating unit is a third distance, and the third distance is approximately equal to the second distance.

In some examples, in each of the plurality of repeating units, a distance, along the first direction, between a center of the first color sub-pixel and the center of the second color sub-pixel pair is a fourth distance, and the fourth distance is approximately equal to the first distance.

In some examples, each sub-pixel includes a light emitting region, and the light emitting region of the first color sub-pixel and the light emitting region of the third color sub-pixel have a shape of a hexagon or an ellipse, and the light emitting region of each second color sub-pixel in the second color sub-pixel pair has a shape of a pentagon, a circle or a droplet-shape.

In some examples, each sub-pixel includes an organic light emitting element and a pixel circuit for driving the organic light emitting element, the organic light emitting element includes a first electrode, a light emitting layer and a second electrode which are stacked in sequence, the first electrode of the organic light emitting element is located at a side of the second electrode of the organic light emitting element away from the base substrate, the pixel circuit includes a light emitting control transistor, and a planarization layer is disposed between the second electrode of the organic light emitting element and the light emitting control transistor; in the first color sub-pixel, the second electrode of the organic light emitting element is connected with the light emitting control transistor through a first via hole located in the planarization layer; in the second color sub-pixel pair, two second electrodes of two organic light emitting elements of the two second color sub-pixels are respectively connected with two light emitting control transistors through two second via holes located in the planarization layer; in the third color sub-pixel, the second electrode of the organic light emitting element is connected with the light emitting control transistor through a third via hole located in the planarization layer.

In some examples, in each of the plurality of repeating units, the two second via holes include a first sub-via hole and a second sub-via hole, and the first via hole, the second sub-via hole and the third via hole are approximately located on a straight line extending along the first direction.

In some examples, in the second color sub-pixel pair, two light emitting regions included in the two second color sub-pixels are located between the first sub-via hole and the second sub-via hole in the second direction.

In some examples, the first via hole, the second sub-via hole and the third via hole in the first repeating unit, and the first sub-via hole in the third repeating unit are approximately located on a straight line extending along the first direction.

In some examples, in each of the plurality of repeating units, a distance between the second sub-via hole and the third via hole along the first direction is a fifth distance, and the fifth distance is less than the first distance.

In some examples, the second distance is less than the fifth distance.

In some examples, in each of the plurality of repeating units, the first via hole is located at a side of the light emitting region of the first color sub-pixel close to the second color sub-pixel pair.

In some examples, in each of the plurality of repeating units, the third via hole is located at a side of the light emitting region of the third color sub-pixel close to the second color sub-pixel pair.

In some examples, the display substrate further includes: a plurality of data lines, extending along the second direction, the plurality of data lines being located at a side of the planarization layer away from the second electrode of the organic light emitting element. A first center line, extending along the second direction, in the light emitting region of each first color sub-pixel is overlapped with the plurality of data lines in a direction perpendicular to the base substrate.

In some examples, the display substrate further includes: a plurality of power signal lines, extending along the second direction, the plurality of power signal lines and the plurality of data lines being arranged alternately in a same layer. An orthographic projection of a second center line extending along the second direction in the light emitting regions of the second color sub-pixel pair on the base substrate is located between an orthographic projection of the power signal line connected with the second color sub-pixel pair on the base substrate and an orthographic projection of the data line connected with the first color sub-pixel adjacent to the second color sub-pixel pair on the base substrate.

In some examples, in the direction perpendicular to the base substrate, a third center line extending along the second direction in the light emitting region of the third color sub-pixel is overlapped with the power signal line.

In some examples, the display substrate further includes: a plurality of scan signal lines, extending along the first direction, and located at a side of a film layer where the plurality of data lines are located facing the base substrate; a plurality of reset power signal lines, extending along the first direction, and located between a film layer where the plurality of scan signal lines are located and the film layer where the plurality of data lines are located; a plurality of reset control signal lines, extending along the first direction, and arranged in the same layer as the plurality of scan signal lines; and a plurality of light emitting control signal lines, extending along the first direction, and arranged in the same layer as the plurality of scan signal lines. The light emitting control transistor includes a first light emitting control transistor and a second light emitting control transistor, and the pixel circuit of each sub-pixel further includes a driving transistor, a data writing transistor, a storage capacitor, a threshold compensation transistor, a first reset transistor and a second reset transistor, a first electrode of the data writing transistor is electrically connected with a first electrode of the driving transistor, a second electrode of the data writing transistor is electrically connected with the data line to receive a data signal, and a gate electrode of the data writing transistor is electrically connected with the scan signal line to receive a scan signal; a first electrode of the storage capacitor is electrically connected with the power signal line, and a second electrode of the storage capacitor is electrically connected with a gate electrode of the driving transistor; a first electrode of the threshold compensation transistor is electrically connected with a second electrode of the driving transistor, a second electrode of the threshold compensation transistor is electrically connected with the gate electrode of the driving transistor, and a gate electrode of the threshold compensation transistor is electrically connected with the scan signal line to receive a compensation control signal; a first electrode of the first reset transistor is electrically connected with the reset power signal line to receive a first reset signal, a second electrode of the first reset transistor is electrically connected with the gate electrode of the driving transistor, and a gate electrode of the first reset transistor is electrically connected with the reset control signal line to receive a first sub-reset control signal; a first electrode of the second reset transistor is electrically connected with the reset power signal line to receive a second reset signal, a second electrode of the second reset transistor is electrically connected with the second electrode of the organic light emitting element, and a gate electrode of the second reset transistor is electrically connected with the reset control signal line to receive a second sub-reset control signal; a first electrode of the first light emitting control transistor is electrically connected with the power signal line, a second electrode of the first light emitting control transistor is electrically connected with the first electrode of the driving transistor, and a gate electrode of the first light emitting control transistor is electrically connected with the light emitting control signal line to receive a first light emitting control signal; and a first electrode of the second light emitting control transistor is electrically connected with the second electrode of the driving transistor, a second electrode of the second light emitting control transistor is electrically connected with the second electrode of the organic light emitting element, and a gate electrode of the second light emitting control transistor is electrically connected with the light emitting control signal line to receive a second light emitting control signal. The display substrate further includes a first connection portion, a second connection portion and a third connection portion which are arranged in the same layer as the plurality of data lines, the first connection portion is configured to connect the second electrode of the threshold compensation transistor and the gate electrode of the driving transistor, the second connection portion is configured to connect the reset power signal line and the first electrode of the second reset transistor, and the third connection portion is configured to connect the second electrode of the organic light emitting element and the second electrode of the second light emitting control transistor.

In some examples, the first color sub-pixel is a red sub-pixel, the second color sub-pixel is a green sub-pixel, and the third color sub-pixel is a blue sub-pixel.

At least one embodiment of the present disclosure provides a display substrate, including: a base substrate; a plurality of repeating units on the base substrate, each of the plurality of repeating units including one first color sub-pixel, one second color sub-pixel pair and one third color sub-pixel which are sequentially arranged along a first direction, the second color sub-pixel pair including two second color sub-pixels which are arranged along a second direction, the plurality of repeating units being arranged along the first direction to form a plurality of repeating unit groups, the plurality of repeating unit groups being arranged along the second direction, and adjacent repeating unit groups among the plurality of repeating unit groups being shifted from each other along the first direction. Each sub-pixel includes an organic light emitting element and a pixel circuit for driving the organic light emitting element, the organic light emitting element includes a first electrode, a light emitting layer and a second electrode which are stacked in sequence, the first electrode of the organic light emitting element is located at a side of the second electrode of the organic light emitting element away from the base substrate; the display substrate includes an active semiconductor layer, the active semiconductor layer includes channel regions and source-drain doped regions of transistors in the pixel circuit of each sub-pixel, the channel regions and the source-drain doped regions of the transistors in a same pixel circuit are integrated, and the pixel circuit includes a driving transistor, a data writing transistor, a storage capacitor, a threshold compensation transistor, a first reset transistor, a second reset transistor, a first light emitting control transistor and a second light emitting control transistor; the display substrate further includes a first conductive layer located at a side of the active semiconductor layer away from the base substrate and a gate insulating layer located between the active semiconductor layer and the first conductive layer, the first conductive layer includes a second electrode of the storage capacitor, a scan signal line extending along the first direction, a reset control signal line extending along the first direction, a light emitting control signal line extending along the first direction, a gate electrode of the driving transistor, a gate electrode of the data writing transistor, a gate electrode of the threshold compensation transistor, a gate electrode of the first light emitting control transistor, a gate electrode of the second light emitting control transistor, a gate electrode of the first reset transistor and a gate electrode of the second reset transistor, and the gate electrode of the driving transistor is also used as the second electrode of the storage capacitor; the display substrate further includes a second conductive layer located at a side of the first conductive layer away from the gate insulating layer, and a first insulating layer located between the second conductive layer and the first conductive layer, and the second conductive layer includes a reset power signal line extending along the first direction and a first electrode of the storage capacitor; the display substrate further includes a source-drain metal layer located at a side of the second conductive layer away from the first insulating layer, and a second insulating layer between the source-drain metal layer and the second conductive layer, and the source-drain metal layer includes a power signal line extending along the second direction, a data line extending along the second direction, a first connection portion, a second connection portion and a third connection portion. A first electrode of the data writing transistor is electrically connected with a first electrode of the driving transistor, a second electrode of the data writing transistor is electrically connected with the data line to receive a data signal, and the gate electrode of the data writing transistor is electrically connected with the scan signal line to receive a scan signal; the first electrode of the storage capacitor is electrically connected with the power signal line, and the second electrode of the storage capacitor is electrically connected with the gate electrode of the driving transistor; a first electrode of the threshold compensation transistor is electrically connected with a second electrode of the driving transistor, a second electrode of the threshold compensation transistor is electrically connected with the gate electrode of the driving transistor, and the gate electrode of the threshold compensation transistor is electrically connected with the scan signal line to receive a compensation control signal; a first electrode of the first reset transistor is electrically connected with the reset power signal line to receive a first reset signal, a second electrode of the first reset transistor is electrically connected with the gate electrode of the driving transistor, and the gate electrode of the first reset transistor is electrically connected with the reset control signal line to receive a first sub-reset control signal; a first electrode of the second reset transistor is electrically connected with the reset power signal line to receive a second reset signal, a second electrode of the second reset transistor is electrically connected with the second electrode of the organic light emitting element, and the gate electrode of the second reset transistor is electrically connected with the reset control signal line to receive a second sub-reset control signal; a first electrode of the first light emitting control transistor is electrically connected with the power signal line, a second electrode of the first light emitting control transistor is electrically connected with the first electrode of the driving transistor, and the gate electrode of the first light emitting control transistor is electrically connected with the light emitting control signal line to receive a first light emitting control signal; a first electrode of the second light emitting control transistor is electrically connected with the second electrode of the driving transistor, a second electrode of the second light emitting control transistor is electrically connected with the second electrode of the organic light emitting element, and the gate electrode of the second light emitting control transistor is electrically connected with the light emitting control signal line to receive a second light emitting control signal; the first connection portion is configured to connect the second electrode of the threshold compensation transistor and the gate of the driving transistor, the second connection portion is configured to connect the reset power signal line and the first electrode of the second reset transistor, and the third connection portion is configured to connect the second electrode of the organic light emitting element and the second electrode of the second light emitting control transistor; the third connection portion includes a first part and a second part, the first part of the third connection portion is electrically connected with the second electrode of the second light emitting control transistor through a fourth via hole penetrating through the gate insulating layer, the first insulating layer and the second insulating layer, and the second part of the third connection portion is electrically connected with the second electrode of the organic light emitting element through a via hole penetrating through the planarization layer. In a direction perpendicular to the base substrate, the second electrode of the organic light emitting element of the first color sub-pixel is overlapped with the power signal line, the data line and the third connection portion, and a first center line extending along the second direction in a light emitting region of the first color sub-pixel is overlapped with the data line, and the power signal line and the third connection portion are located at both sides of the data line.

In some examples, in a same repeating unit, the fourth via hole of the first color sub-pixel, the fourth via hole of the third color sub-pixel and the fourth via hole of one second color sub-pixel are located on a straight line extending along the first direction and are arranged at equal intervals; three fourth via holes in the first repeating unit, three fourth via holes in the second repeating unit and one fourth via hole of one second color sub-pixel in the third repeating unit are located on a straight line extending along the first direction and are arranged at equal intervals.

In some examples, in the first color sub-pixel, the second electrode of the organic light emitting element is connected with the second light emitting control transistor through a first via hole located in the planarization layer; in the second color sub-pixel pair, two second electrodes of organic light emitting elements of two second color sub-pixels are respectively connected with two second light emitting control transistors through two second via holes located in the planarization layer; in the third color sub-pixel, the second electrode of the organic light emitting element is connected with the second light emitting control transistor through a third via hole located in the planarization layer, the fourth via hole of the second color sub-pixel is not overlapped with the light emitting region of the second color sub-pixel, the fourth via hole of the second color sub-pixel is located at a side of the second via hole of the second color sub-pixel close to the first via hole of the first color sub-pixel, orthogonal projections of the fourth via hole of the second color sub-pixel and the second via hole of the second color sub-pixel on a straight line extending along the second direction are overlapped, and a straight line extending along the first direction passes through the fourth via hole of the second color sub-pixel and the second via hole of the second color sub-pixel.

In some examples, the first via hole of the first color sub-pixel and the fourth via hole of the first color sub-pixel are intersected with a straight line extending along the second direction, and the third via hole of the third color sub-pixel and the fourth via hole of the third color sub-pixel are intersected with a straight line extending along the second direction.

In some examples, in the direction perpendicular to the base substrate, one of two second electrodes of the organic light emitting elements included in the second color sub-pixel pair is overlapped with the data line, the power signal line, the second connection portion and the third connection portion, and a second center line extending along the second direction in light emitting regions of the second color sub-pixel pair is overlapped with the third connection portion, the second connection portion and the power signal line are located at one side of the second center line, and the data line is located at the other side of the second center line; and in the direction perpendicular to the base substrate, the other of the two second electrodes of the organic light emitting elements included in the second color sub-pixel pair is overlapped with the data line, the power signal line, and the first connection portion and the third connection portion, the second center line is overlapped with the third connection portion, the first connection portion and the power signal line are located at one side of the second center line, and the data line is located at the other side of the second center line.

In some examples, in the direction perpendicular to the base substrate, the second electrode of the organic light emitting element of the third color sub-pixel is overlapped with the data line, the power signal line, the first connection portion, the second connection portion and the third connection portion; and a third center line extending along the second direction in a light emitting region of the third color sub-pixel is overlapped with the power signal line, the data line is located at one side of the third center line, and the first connection portion, the second connection portion and the third connection portion are located at the other side of the third center line.

Another embodiment of the present disclosure provides a display device, including the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Figure 1:
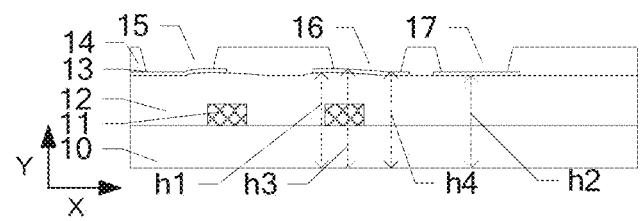
FIG. 1 is a partial cross-sectional structural view of a display substrate.

FIG. 1 is a partial cross-sectional structural view of a display substrate. As shown in FIG. 1, the display substrate includes a film 10, and the film 10 includes a base substrate, an active semiconductor layer on the base substrate, and at least one conductive layer on the side of the active semiconductor layer away from the base substrate. The display substrate further includes a source-drain metal layer 11 on the film 10, and for example, the source-drain metal layer 11 can include traces such as data lines and power signal lines, etc. The display substrate further includes a planarization layer 12 on the side of the source-drain metal layer 11 away from the film 10, an anode 13 on the side of the planarization layer 12 away from the source-drain metal layer 11, and a pixel defining layer 14 on the side of the anode 13 away from the planarization layer 12. The pixel defining layer 14 includes a plurality of openings 15-17 for defining light emitting regions of sub-pixels. The plurality of openings 15-17 expose a part of the anode 13, and when an organic light emitting layer is subsequently formed in the openings 15-17 of the pixel defining layer 14, the organic light emitting layer is in contact with the anode 13, so that this part can drive the organic light emitting layer to emit light.

As shown in FIG. 1, the thickness of the source-drain metal layer 11 is relatively large, and for example, the thickness can be in the range from 0.6 to 0.9 um, which may cause the surface of the planarization layer 12 on the source-drain metal layer 11 facing the anode 13 to be uneven. For example, a distance between a surface, away from the film 10, of the planarization layer 12 directly above the source-drain metal layer 11 (e.g., data lines, power signal lines, and patterns in the same layer and made of the same material) and a surface, away from the planarization layer 12, of the film 10, is h1, and a distance between a surface, away from the film 10, of the planarization layer 12 directly above a region where the source-drain metal layer 11 is not provided, and the surface, away from the planarization layer 12, of the film 10, is h2, and h1>h2.

As shown in FIG. 1, in the opening 16, the source-drain metal layer 11 is provided directly below one part of the planarization layer 12, while the source-drain metal layer 11 is not provided directly below the other part of the planarization layer 12, so that the surface, facing the anode 13, of the planarization layer 12 in the opening 16 is uneven, as a result, the surface of the anode 13 on the planarization layer 12 is also uneven. For example, in terms of the anode 13 located in the opening 16, a distance between a surface, away from the film 10, of the anode 13 directly above the source-drain metal layer 11, and a surface, away from the anode 13, of the film 10, is h3, and a distance between a surface, away from the film 10, of the anode 13 at a position where the source-drain metal layer 11 is not provided, and the surface, away from the anode 13, of the film 10, is h4, and h3>h4. As a result, the anode 13 in the opening 16 is inclined. In the same way, the anode 13 in the opening 15 is also inclined, and the inclined direction of the anode 13 in the opening 15 is different from the inclined direction of the anode 13 in the opening 16 according to the difference between the positions of the source-drain metal layer 11, resulting in inconsistent luminous intensity of the sub-pixels corresponding to the opening 15 and the opening 16 in different directions. Taking the direction indicated by the arrow in the X direction as the right direction, the light emitting regions of the sub-pixels defined by the opening 15 and the opening 16 emit light of inconsistent intensities to the left and right sides. No source-drain metal layer 11 is provided directly below the anode 13 in the opening 17, so the surface of the anode 13 in the opening 17 is basically flat without being inclined, and the light emitting region of the sub-pixel defined by the opening 17 emits light of a consistent intensity in different directions. As to the light emitting regions of three adjacent sub-pixels of different colors defined by the openings 15-17, the anode 13 in the opening 15 inclines to the left, the anode 13 in the opening 16 inclines to the right, and the anode 13 in the opening 17 is not inclined; as a result, the "inclined" directions of the anodes 13 in sub-pixels of different colors are different, resulting in mismatched intensities of light emitted to the left and right sides from the light emitting regions of the three sub-pixels. A display device adopting such a display substrate will have a large viewing angle color cast, and when viewed by human eyes, a color cast phenomenon similar to one side being red and the other side being blue occurs.

Figure 2:
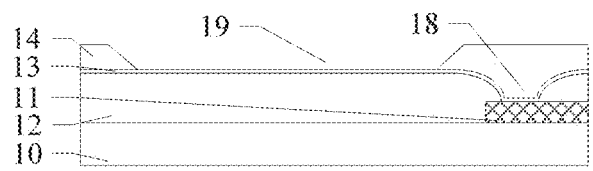
FIG. 2 is a partial cross-sectional structural view of another display substrate.

FIG. 2 is a partial cross-sectional structural view of another display substrate. The display substrate shown in FIG. 2 includes the film 10, the source-drain metal layer 11, the planarization layer 12, the anode 13 and the pixel defining layer 14 shown in FIG. 1. As shown in FIG. 2, the planarization layer 12 in the display substrate includes a via hole 18 so that the anode 13 can be electrically connected with the source-drain metal layer 11. The pixel defining layer 14 includes an opening 19 to expose a part of the anode 13, and when an organic light emitting layer is subsequently formed in the opening 19, the organic light emitting layer is in contact with the anode 13 to form a light emitting region.

As shown in FIG. 2, the via hole 18 is located at the outer side of the light emitting region; the anode 13 located at the periphery of the via hole 18 inclines, a certain distance should be set between the light emitting region and the via hole 18 to ensure the flatness of the anode 13 in the light emitting region, thus avoiding the occurrence of the color cast phenomenon of the display substrate.

As shown in FIGS. 1-2, the positional relationship between the source-drain metal layer 11 and the anode 13, and the positional relationship between the via hole 18 in the planarization layer 12 and the anode 13 all affect the flatness of the anode 13 in the light emitting region, which leads to the easy occurrence of color cast on the display substrate.

Figure 3:
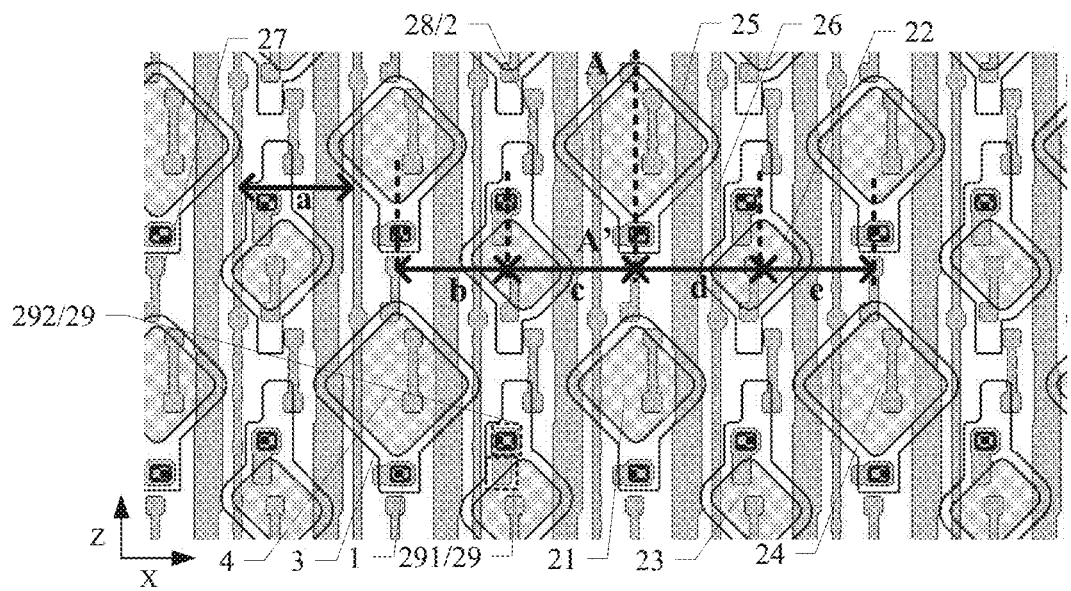
FIG. 3 is a partial planar structural view of a pixel arrangement structure and traces on a display substrate.
Figure 4:
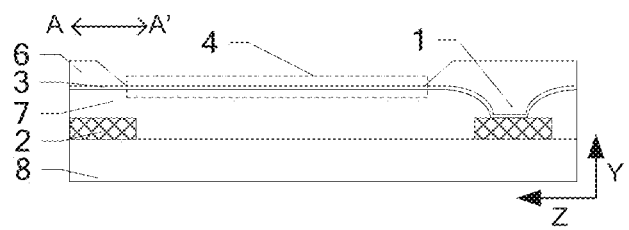
FIG. 4 is a partial cross-sectional structural view taken along line AA' shown in FIG. 3.

FIG. 3 is a partial planar structural view of a pixel arrangement structure and traces on a display substrate, and FIG. 4 is a partial cross-sectional structural view taken along line AA' shown in FIG. 3. As shown in FIG. 3, the display substrate includes a plurality of red sub-pixels 21, a plurality of green sub-pixel pairs (each green sub-pixel pair includes two green sub-pixels 22 and 23), and a plurality of blue sub-pixels 24. The plurality of red sub-pixels 21 and the plurality of blue sub-pixels 24 are alternately arranged along the X and Z directions, the plurality of green sub-pixels are arrayed along the X and Z directions, and every four green sub-pixels surround one red sub-pixel 21 or one blue sub-pixel 24. The shape of the red sub-pixel 21 and the shape of the blue sub-pixel 24 are both diamond-shaped, and two diagonal lines of the diamond shape extend along the X direction and the Z direction, respectively. The side of the red sub-pixel 21 and the side of the green sub-pixel which are adjacent to each other are approximately parallel to each other, and the side of the green sub-pixel and the side of the blue sub-pixel 24 which are adjacent to each other are approximately parallel to each other. Due to process limitations, the shapes of the red sub-pixel and the blue sub-pixel may not be a strict diamond shape, but an approximate diamond shape, such as a rounded diamond shape. The rounded diamond shape is a shape formed by rounding the corners of a diamond shape. Similarly, the shape of the green sub-pixel may not be a strict rectangle, but an approximate rectangle, such as a rounded rectangle. The rounded rectangle is a shape formed by rounding the corners of a rectangle.

Each of the red sub-pixel, the green sub-pixel and the blue sub-pixel described above includes, for example, an anode, a cathode, and a light emitting layer located between the two electrodes. For example, because the light emitting layer effectively emits light only at the part where the anode is in contact with the light emitting layer, the shape of the sub-pixel is roughly the same as the shape of the part of the light emitting layer which is in contact with the anode, or the shape of the sub-pixel is roughly the same as the shape of a corresponding opening in the pixel defining layer.

Each of the red sub-pixel, the green sub-pixel and the blue sub-pixel described above includes a pixel circuit, the pixel circuit can include a 7T1C (i.e., seven transistors and one capacitor) structure, which includes, for example, a driving transistor, a data writing transistor, a storage capacitor, a threshold compensation transistor, a first reset transistor, a second reset transistor, a first light emitting control transistor and a second light emitting control transistor.

As shown in FIGS. 3-4, the film 8 of the display substrate can include a base substrate, an active semiconductor layer on the base substrate, and at least one conductive layer on the side of the active semiconductor layer away from the base substrate. The display substrate further includes a source-drain metal layer 2 on the film 8, and for example, the source-drain metal layer 2 can include a data line 26, a power signal line 25, a first connection portion 28, a second connection portion 27 and a third connection portion 29. The data line 26 is connected with the driving transistor; the power signal line 25 is connected with the first light emitting control transistor; two ends of the first connection portion 28 are respectively connected with the gate electrodes of the threshold compensation transistor and the driving transistor; two ends of the second connection portion 27 are respectively connected with a reset power signal line and the second reset transistor; and a first part 291 of the third connection portion is connected with the second light emitting control transistor.

As shown in FIGS. 3-4, the display substrate further includes a planarization layer 7 at a side of the source-drain metal layer 2 away from the film 8, an anode 3 at a side of the planarization layer 7 away from the source-drain metal layer 2, and a pixel defining layer 6 at a side of the anode 3 away from the planarization layer 7. The anode 3 is connected with a second part 292 of the third connection portion through a via hole 1 in the planarization layer 7 to realize the connection with the second light emitting control transistor. The second part 292 of the third connection portion is an integrated structure with the first part 291 of the third connection portion, the first part 291 is the source-drain metal layer at the position opposite to the source electrode or the drain electrode of the second light emitting control transistor, and the second part 292 is the source-drain metal layer at the position opposite to the via hole 1 in the planarization layer 7. The pixel defining layer 6 includes an opening for defining a light emitting region of a sub-pixel, the opening exposes a part of the anode 3; and when an organic light emitting layer is subsequently formed in the opening of the pixel defining layer 6, the organic light emitting layer is in contact with the anode 3, so that this contact part can drive the organic light emitting layer to emit light, so as to form the light emitting region 4.

As shown in FIGS. 3-4, the distance a between adjacent data lines 26 is the width of the pixel circuit of one sub-pixel, and the pixel circuits of the sub-pixels are repeatedly arranged along the X direction and the Z direction. Among the sub-pixels arranged along the X direction, the distance between the center of the red sub-pixel 21 and the center of the green sub-pixel 23 adjacent to the red sub-pixel 21 along the X direction is b, the distance between the center of the green sub-pixel 23 and the center of the blue sub-pixel 24 adjacent to the green sub-pixel 23 along the X direction is c, the distance between the center of the blue sub-pixel 24 and the center of the green sub-pixel 22 adjacent to the blue sub-pixel 24 along the X direction is d, the distance between the center of the green sub-pixel 22 and the center of the red sub-pixel 21 adjacent to the green sub-pixel 22 along the X direction is e, and a=b=c=d=e. The above-mentioned "center" refers to the geometric center of the planar shape of the light emitting region of each color sub-pixel.

As shown in FIGS. 3-4, the centers of the light emitting regions of the sub-pixels described above are arranged at equal intervals, and the interval is approximately equal to the width of the pixel circuit of each sub-pixel. In this case, the light emitting region of the green sub-pixel is overlapped with the first part 291 of the third connection portion; in order not to affect the flatness of the anode in the light emitting region, a relatively large distance is needed between the position of the via hole 1 in the planarization layer 7 and the first part 291 of the third connection portion 29; and therefore, with respect to the position of the source/drain electrode, which is configured to be connected with the anode, of the second light emitting control transistor, the position of the via hole in the planarization layer in the figure has been greatly adjusted along the Z direction, which has a great influence on the overall pixel circuit structure. In addition, as shown in FIGS. 3-4, in the cross-sectional view taken along the center line AA' of the light emitting region of the blue sub-pixel 24 (only the positional relationship between the source-drain metal layer 2 and the anode 3 is illustratively shown in the figure, and the anode 3 located on the source-drain metal layer 2 may be uneven in an actual product), along the Z direction, no source-drain metal layer 2 is provided directly below the middle position of the anode 3 of the blue sub-pixel 24, while the source-drain metal layer 2 is arranged below the positions on both sides of the anode 3 of the blue sub-pixel 24, which affects the flatness of the anode 3 of the blue sub-pixel 24 along the Z direction, and further causes the blue sub-pixel 24 to easily produce color cast when displaying.

The embodiments of the present disclosure provide a display substrate and a display device. The display substrate includes a base substrate and a plurality of repeating units located on the base substrate. Each repeating unit includes one first color sub-pixel, one second color sub-pixel pair and one third color sub-pixel which are sequentially arranged along a first direction, the second color sub-pixel pair includes two second color sub-pixels arranged along a second direction, the plurality of repeating units are arranged along the first direction to form a plurality of repeating unit groups, the plurality of repeating unit groups are arranged along the second direction, and adjacent repeating unit groups among the plurality of repeating unit groups are shifted from each other along the first direction. In each repeating unit, a distance, along the first direction, between a center of the third color sub-pixel and a center of the second color sub-pixel pair is a first distance; two adjacent repeating units located in a same repeating unit group include a first repeating unit and a second repeating unit, the third color sub-pixel of the first repeating unit is adjacent to the first color sub-pixel of the second repeating unit, a repeating unit adjacent to both the first repeating unit and the second repeating unit and located in an adjacent repeating unit group is a third repeating unit, a distance, along the first direction, between a center of the third color sub-pixel in the first repeating unit and a center of the second color sub-pixel pair in the third repeating unit is a second distance, and the first distance is different from the second distance. The embodiments of the present disclosure, by adjusting the distances between centers of the sub-pixels along the first direction, the occurrence of the color cast phenomenon can be avoided as much as possible while ensuring that the position of the via hole in the planarization layer is not greatly adjusted to reduce the influence on the overall pixel circuit structure.

Hereinafter, the display substrate and the display device provided by the embodiments of the present disclosure will be described with reference to the accompanying drawings.

Figure 5:
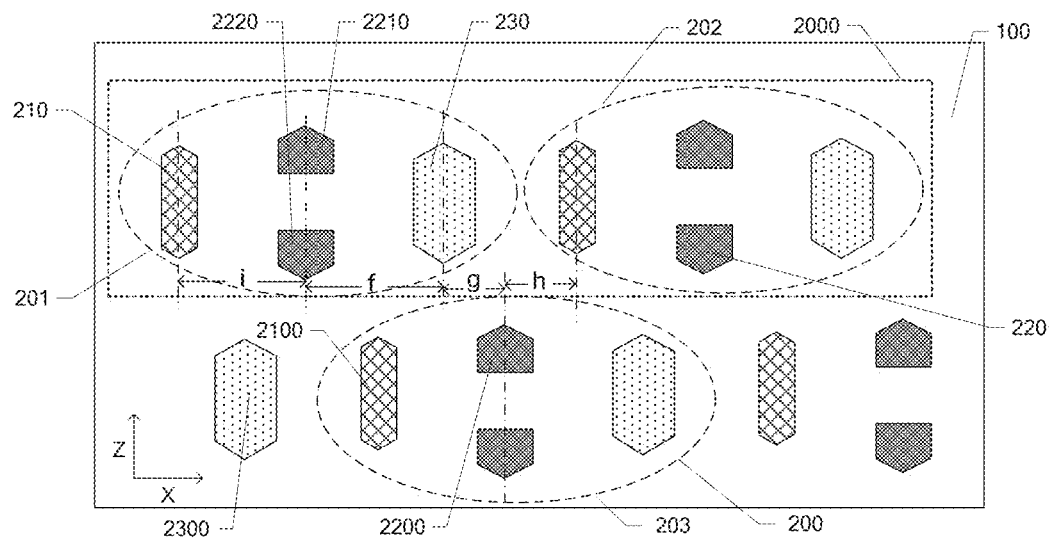
FIG. 5 is a schematic diagram of a pixel arrangement structure of a display substrate provided by an embodiment of the present disclosure.
Figure 6:
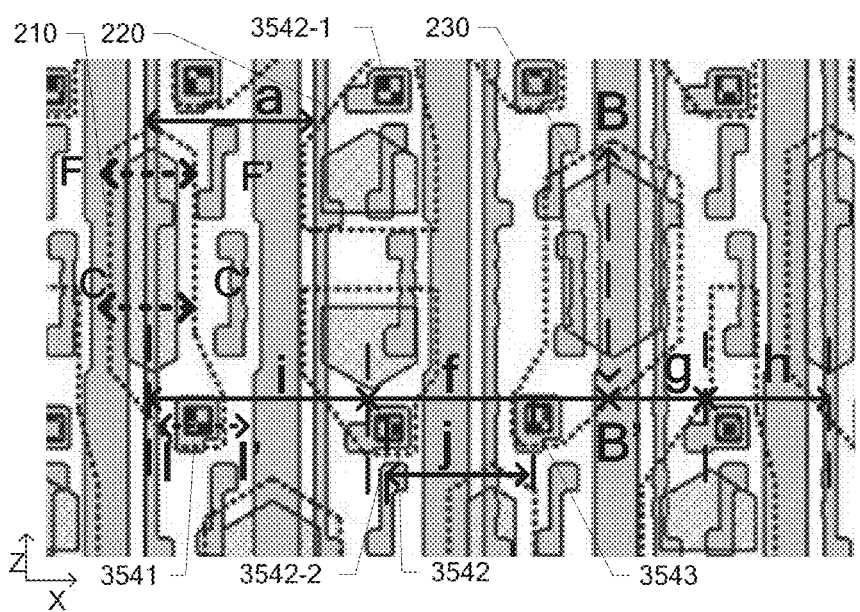
FIG. 6 is a partial planar structural view of the display substrate shown in FIG. 5.

FIG. 5 is a schematic diagram of a pixel arrangement structure of a display substrate provided by an embodiment of the present disclosure, and FIG. 6 is a partial planar structural view of the display substrate shown in FIG. 5. For convenience of showing the positional relationship, FIG. 6 merely shows two films: the second electrode and the source-drain metal layer. As shown in FIGS. 5-6, the display substrate includes a base substrate 100 and a plurality of repeating units 200 on the base substrate 100. Each repeating unit 200 includes one first color sub-pixel 210, one second color sub-pixel pair 220 and one third color sub-pixel 230 which are arranged along a first direction (X direction shown in the figure), and two second color sub-pixels 2210 and 2220 included in the second color sub-pixel pair 220 are arranged along a second direction (Z direction shown in the figure, which is different from the first direction). The plurality of repeating units 200 are arranged along the first direction to form a plurality of repeating unit groups 2000, the plurality of repeating unit groups 2000 are arranged along the second direction, and adjacent repeating unit groups 2000 among the plurality of repeating unit groups 2000 are shifted from each other along the first direction, that is, the adjacent repeating unit groups 2000 have a certain shift in the first direction. Therefore, sub-pixels of the same color in the adjacent repeating unit groups 2000 are not aligned in the second direction. The pixel arrangement manner of the odd-numbered row of repeating unit groups 2000 is the same, and the pixel arrangement manner of the even-numbered row of repeating unit groups 2000 is the same.

For example, a shift amount between adjacent repeating unit groups 2000 in the first direction is approximately half of the size of the repeating unit 200 in the first direction. For example, the size of the repeating unit 200 in the first direction is the pitch of the repeating units 200 in the first direction. Here, the pitch refers to the distance between the centers of the light emitting regions of two first color sub-pixels 210 in two adjacent repeating units 200 along the first direction, and the center of the light emitting region refers to the geometric center of the planar shape of the light emitting region.

The first direction and the second direction described above are two directions perpendicular to each other in the same plane. For example, the plane is a plane where the pixels are arranged. The repeating unit here only refers to the repetition of sub-pixels, and other structures can be different or the same. In addition, the above repetition means that the approximate positions, shapes and sizes are almost the same.

In some cases, for wiring or opening needs, the shape may be slightly different, for example, openings are arranged at different positions.

As shown in FIGS. 5-6, in each repeating unit 200, the distance, along the first direction, between the center of the third color sub-pixel 230 and the center of the second color sub-pixel pair 220 is a first distance f. That is, in each repeating unit 200, the distance between the center line of the third color sub-pixel 230 extending along the second direction and the center line of the second color sub-pixel pair extending along the second direction is the first distance. In the embodiments of the present disclosure, the center of each sub-pixel refers to the geometric center of the shape of the light emitting region of each sub-pixel, and the center line of each sub-pixel extending along the second direction refers to the center line passing through the geometric center of the light emitting region. In the embodiments of the present disclosure, the center of the second color sub-pixel pair refers to the midpoint of the connection line between the centers of the two light emitting regions of the two second color sub-pixels.

As shown in FIGS. 5-6, two adjacent repeating units 200 located in the same repeating unit group 2000 include a first repeating unit 201 and a second repeating unit 202, the third color sub-pixel 230 of the first repeating unit 201 is adjacent to the first color sub-pixel 210 of the second repeating unit 202, and a repeating unit 200 adjacent to both the first repeating unit 201 and the second repeating unit 202 and located in an adjacent repeating unit group 2000 is a third repeating unit 203. The above-mentioned "the repeating unit 200 adjacent to both the first repeating unit 201 and the second repeating unit 202 and located in the adjacent repeating unit group 2000 is a third repeating unit 203" means that there is no other repeating unit between the third repeating unit 203 and the first repeating unit 201, and there is no other repeating unit between the third repeating unit 203 and the second repeating unit 202.

As shown in FIGS. 5-6, the distance, along the first direction, between the center of the third color sub-pixel 230 in the first repeating unit 201 and the center of the second color sub-pixel pair 220 in the third repeating unit 203 is a second distance g. That is, the distance between the center line of the third color sub-pixel 230 extending in the second direction in the first repeating unit 201 and the center line of the second color sub-pixel pair 220 extending in the second direction in the third repeating unit 203 is the second distance.

As shown in FIGS. 5-6, the first distance is not equal to the second distance. The embodiment of the present disclosure, by setting the distances between the center lines of the sub-pixels extending along the second direction, the occurrence of the color cast phenomenon can be avoided as much as possible while ensuring that the position of the via hole in the planarization layer is not greatly adjusted to reduce the influence on the overall pixel circuit structure.

For example, as shown in FIGS. 5-6, the first distance is greater than the second distance. Therefore, it can avoid the occurrence of the color cast phenomenon as much as possible while ensuring that the position of the via hole in the planarization layer is not greatly adjusted to reduce the influence on the overall pixel circuit structure.

For example, the ratio of the first distance to the second distance can be in the range from 1.5 to 2.3. For example, the ratio of the first distance to the second distance can be in the range from 1.8 to 2.0.

For example, as shown in FIGS. 5-6, the pixel size of the pixel circuit (described later) of each sub-pixel along the first direction is a, the ratio of the first distance to the pixel size a is about 1.3, and the ratio of the second distance to the pixel size a is about 0.7. The size of the pixel circuit described above may refer to the distance between adjacent data lines (to be described later).

For example, as shown in FIGS. 5-6, the distance, along the first direction, between the center of the first color sub-pixel 210 in the second repeating unit 202 and the center of the second color sub-pixel pair 220 in the third repeating unit 203 is a third distance h. That is, the distance between the center line of the first color sub-pixel 210 extending in the second direction in the second repeating unit 202 and the center line of the second color sub-pixel pair 220 extending in the second direction in the third repeating unit 203 is the third distance.

For example, as shown in FIGS. 5-6, the third distance is approximately equal to the second distance. Here and hereafter, "approximately equal" means that the ratio between them is in the range from 0.9 to 1.1. In some embodiments, the size, along the Z direction, of the light emitting region of the first color sub-pixel 210 in the second repeating unit 202 is greater than the size, along the Z direction, of the light emitting region of the third color sub-pixel 230 in the first repeating unit 201, and in order to ensure that the distance (PDL gap) between the boundaries of the light emitting regions of sub-pixels of different colors is consistent, the third distance can be slightly greater than the second distance.

For example, as shown in FIGS. 5-6, the distance, along the first direction, between the center of the first color sub-pixel 210 and the center of the second color sub-pixel pair 220 in each repeating unit 200 is a fourth distance i. That is, the distance between the center line of the first color sub-pixel 210 extending in the second direction and the center line of the second color sub-pixel pair 220 extending in the second direction is the fourth distance. The fourth distance is approximately equal to the first distance. In some embodiments, in the same repeating unit 200, the size, along the X direction, of the light emitting region of the first color sub-pixel 210 is less than the size, along the X direction, of the light emitting region of the third color sub-pixel 230, and in order to ensure that the PDL gap between the boundaries of the light emitting regions of sub-pixels of different colors is consistent, the first distance is slightly greater than the fourth distance. The PDL gap between the boundaries of the light emitting regions of sub-pixels of different colors is consistent, thus ensuring that the product resolution and aperture ratio are maximized under a certain process precision condition.

For example, as shown in FIGS. 5-6, the distance between the center of the first color sub-pixel 210 and the center of the third color sub-pixel 230 in each repeating unit 200 is i+f, and the distance between the centers of the first color sub-pixel 210 and the third color sub-pixel 230 which are adjacent to each other and respectively in two adjacent repeating units 200 in the same repeating unit group 2000 is g+h, and the ratio of these two distances is in the range from 1.5 to 2. For example, in each repeating unit 200, the distance between the center line of the first color sub-pixel 210 extending in the Z direction and the center line of the third color sub-pixel 230 extending in the Z direction is i+f; the distance between the center line, extending in the Z direction, of the third color sub-pixel 230 in the first repeating unit 201, and the center line, extending in the Z direction, of the first color sub-pixel 210 in the second repeating unit 202 is g+h; and the ratio of these two distances is in the range from 1.5 to 2.3, and for example, the ratio of these two distances can be in the range from 1.8 to 2.0. For example, in the same repeating unit group 2000, the distances from the center line, extending in the Z direction, of a first color sub-pixel 210 to the center lines, extending in the Z direction, of the two third color sub-pixels 230 adjacent to the first color sub-pixel 210 are i+f and g+h, respectively. For example, in the same repeating unit group 2000, the ratio of the distances from the center line, extending in the Z direction, of the first color sub-pixel 210 to the center lines, extending in the Z direction, of the two third color sub-pixels 230 adjacent to the first color sub-pixel 210 is in the range from 1.5 to 2.3, and for example, in the range from 1.8 to 2.0. For example, in the same repeating unit group 2000, the distances from the center line, extending in the Z direction, of a third color sub-pixel 230 to the center lines, extending in the Z direction, of the two first color sub-pixels 210 adjacent to the third color sub-pixel 230 are i+f and g+h, respectively. For example, in the same repeating unit group 2000, the ratio of the distances from the center line, extending in the Z direction, of the third color sub-pixel 230 to the center lines, extending in the Z direction, of the two first color sub-pixels 210 adjacent to the third color sub-pixel 230 is in the range from 1.5 to 2.3, and for example, in the range from 1.8 to 2.0.

For example, in an example of the embodiment of the present disclosure, the first color sub-pixel 210 is a red sub-pixel and the third color sub-pixel 230 is a blue sub-pixel. Compared with the display substrate shown in FIG. 3 where the distances, along the X direction, between the two blue sub-pixels adjacent to a red sub-pixel and the red sub-pixel are the same, the embodiment of the present disclosure, by adjusting the distance relationship between the red sub-pixel and the blue sub-pixel arranged along the X direction, the occurrence of the color cast phenomenon can be avoided as much as possible while ensuring that the position of the via hole in the planarization layer is not greatly adjusted to reduce the influence on the overall pixel circuit structure.

Figure 7A:
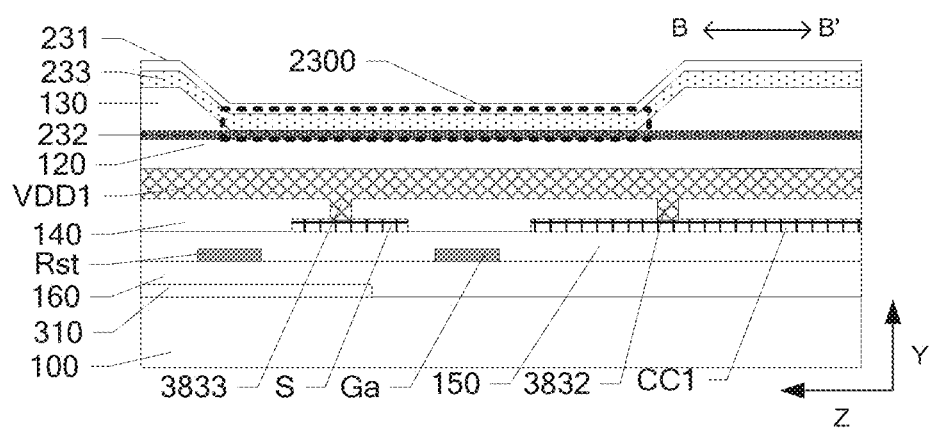
FIG. 7A is a partial cross-sectional structural view of a display substrate in an example taken along line BB' shown in FIG. 6.

FIG. 7A is a partial cross-sectional structural view taken along line BB' shown in FIG. 6. As shown in FIG. 7A, each sub-pixel, for example, a third color sub-pixel, includes an organic light emitting element; the organic light emitting element includes a first electrode 231, a second electrode 232 and a light emitting layer 233 located between the first electrode 231 and the second electrode 232; and the second electrode 232 is located between the first electrode 231 and the base substrate 100. The display substrate further includes a pixel defining layer 130, the pixel defining layer 130 includes an opening for defining a light emitting region of each sub-pixel, and the shape of the light emitting region of the sub-pixel can be defined by the opening of the pixel defining layer. For example, taking the third color sub-pixel as an example, the second electrode 232 of the organic light emitting element can be disposed between the pixel defining layer 130 and the base substrate 100, and the opening, which is used for defining the sub-pixel and included in the pixel defining layer 130 exposes a part of the second electrode 232; when the light emitting layer 233 is formed in the opening of the pixel defining layer 130, the light emitting layer 233 is in contact with the second electrode 232, so that this part can drive the light emitting layer 233 to emit light, and the opening of the pixel defining layer 130 defines the shape of the light emitting region 2300 of the third color sub-pixel 230. Similarly, the openings of the pixel defining layer also define the shapes of the light emitting regions of the first color sub-pixel and the second color sub-pixel.

For example, as shown in FIGS. 5-7A, each sub-pixel includes a light emitting region, the shape of the light emitting region 2100 of the first color sub-pixel 210 and the shape of the light emitting region 2300 of the third color sub-pixel 230 include a hexagon or an ellipse, and the shape of the light emitting region 2200 of each second color sub-pixel 2210 and 2220 in the second color sub-pixel pair 220 includes a pentagon, a circle or a droplet-shape.

For example, as shown in FIGS. 5-7A, the light emitting region 2100 of the first color sub-pixel 210 and the light emitting region 2300 of the third color sub-pixel 230 are hexagonal in shape, and three pairs of opposite sides in the hexagon are parallel to each other, respectively, and the light emitting region 2100 of the first color sub-pixel 210 and the light emitting region 2300 of the third color sub-pixel 230 include sides parallel to the second direction. The shape of the light emitting region 2200 of each second color sub-pixel 2210 (or 2220) is a pentagon, the pentagon includes a pair of parallel opposite sides (parallel to the second direction) and a vertical side (parallel to the first direction), and the vertical side is perpendicular to the pair of parallel opposite sides, and the two vertical sides of the light emitting regions 2200 in each second color sub-pixel pair 220 are adjacent to each other.

In addition, although the shape of the light emitting region of each sub-pixel in FIGS. 5-6 includes an angle strictly formed by two line segments, in some embodiments, the shape of the light emitting region of each sub-pixel may be a pattern with a rounded corner, such as a circle or a droplet-shape. That is, on the basis of the above various pattern shapes, the corners of the light emitting region of each sub-pixel are rounded. For example, when the opening of the pixel defining layer is formed, the part at the corner of the opening can be formed in a rounded shape, so that the shape of the light emitting region formed can be a rounded shape.

For example, the embodiment of the present disclosure is described by taking that the first color sub-pixel 210 is a red sub-pixel, the second color sub-pixel 220 is a green sub-pixel and the third color sub-pixel 230 is a blue sub-pixel as an example. But it is not limited thereto, the colors of sub-pixels can be interchanged.

Figure 8:
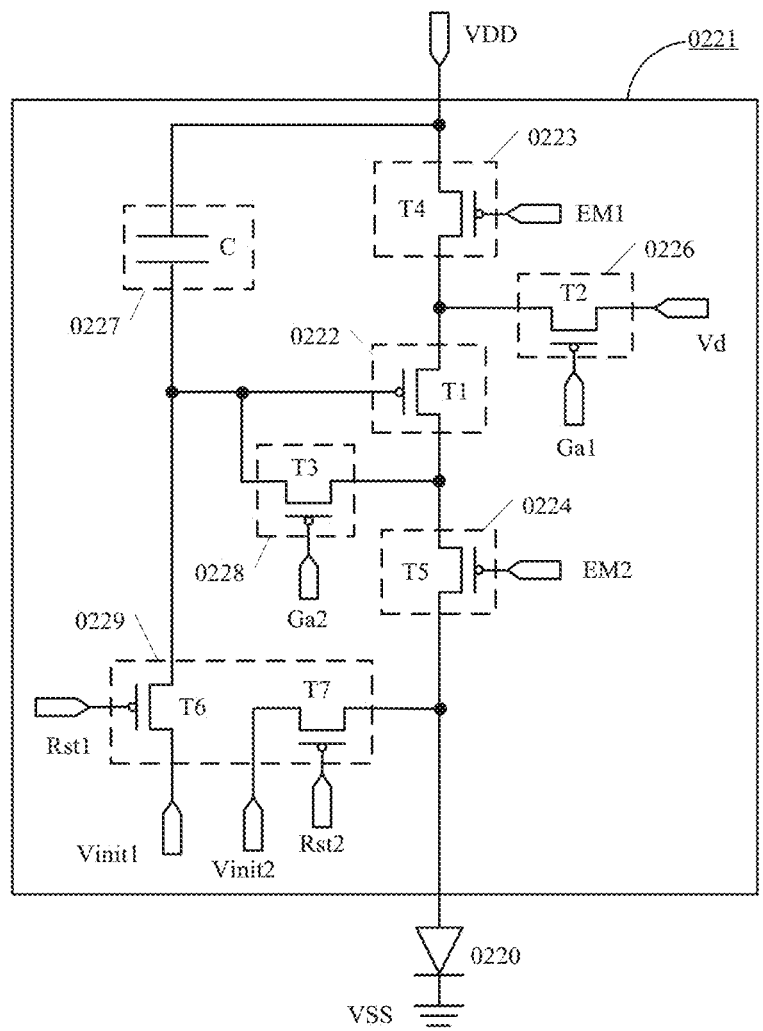
FIG. 8 is a schematic diagram of a pixel circuit included in each sub-pixel and connected with an organic light emitting element.

FIG. 8 is a schematic diagram of a pixel circuit included in each sub-pixel and connected with an organic light emitting element. As shown in FIG. 8, the pixel circuit 0221 of each sub-pixel can include a driving circuit 0222, a first light emitting control circuit 0223, a second light emitting control circuit 0224, a data writing circuit 0226, a storage circuit 0227, a threshold compensation circuit 0228 and a reset circuit 0229. The driving circuit 0222 includes a control terminal, a first terminal and a second terminal, and is configured to provide the organic light emitting element 0220 with a driving current which is used for driving the organic light emitting element 0220 to emit light.

For example, the first light emitting control circuit 0223 is connected with a first voltage terminal VDD and the first terminal of the driving circuit 0222, and is configured to connect or disconnect the driving circuit 0222 and the first voltage terminal VDD; the second light emitting control circuit 0225 is connected with the second terminal of the driving circuit 0222 and the first electrode of the organic light emitting element 0220, respectively, and is configured to connect or disconnect the driving circuit 0222 and the first electrode of the organic light emitting element 0220. The data writing circuit 0226 is electrically connected with the first terminal of the driving circuit 0222, and is configured to write a data signal into the storage circuit 0227 under the control of a scan signal. The storage circuit 0227 is electrically connected with the control terminal of the driving circuit 0222 and the first voltage terminal VDD, respectively, and is configured to store the data signal. The threshold compensation circuit 0228 is electrically connected with the control terminal and the second terminal of the driving circuit 0222, respectively, and is configured to perform threshold compensation on the driving circuit 0222. The reset circuit 0229 is electrically connected with the control terminal of the driving circuit 0222 and the first electrode of the organic light emitting element 0220, and is configured to reset the control terminal of the driving circuit 0222 and the first electrode of the organic light emitting element 0220 under the control of a reset control signal.

For example, as shown in FIG. 8, the driving circuit 0222 includes a driving transistor T1, the control terminal of the driving circuit 0222 includes the gate electrode of the driving transistor T1, the first terminal of the driving circuit 0222 includes the first electrode of the driving transistor T1, and the second terminal of the driving circuit 0222 includes the second electrode of the driving transistor T1. The data writing circuit 0226 includes a data writing transistor T2, the storage circuit 0227 includes a capacitor C, the threshold compensation circuit 0228 includes a threshold compensation transistor T3, the first light emitting control circuit 0223 includes a first light emitting control transistor T4, the second light emitting control circuit 0224 includes a second light emitting control transistor T5, and the reset circuit 0229 includes a first reset transistor T6 and a second reset transistor T7, the reset control signal may include a first sub-reset control signal and a second sub-reset control signal.

For example, as shown in FIG. 8, the first electrode of the data writing transistor T2 is electrically connected with the first electrode of the driving transistor T1, the second electrode of the data writing transistor T2 is configured to be electrically connected with a data line Vd to receive a data signal, and the gate electrode of the data writing transistor T2 is configured to be electrically connected with a first scan signal line Ga1 to receive a scan signal; the first electrode of the capacitor C is electrically connected with the first power terminal VDD, and the second electrode of the capacitor C is electrically connected with the gate electrode of the driving transistor T1; the first electrode of the threshold compensation transistor T3 is electrically connected with the second electrode of the driving transistor T1, the second electrode of the threshold compensation transistor T3 is electrically connected with the gate electrode of the driving transistor T1, and the gate electrode of the threshold compensation transistor T3 is configured to be electrically connected with a second scan signal line Ga2 to receive a compensation control signal; the first electrode of the first reset transistor T6 is configured to be electrically connected with a first reset power terminal Vinit1 to receive a first reset signal, the second electrode of the first reset transistor T6 is electrically connected with the gate electrode of the driving transistor T1, and the gate electrode of the first reset transistor T6 is configured to be electrically connected with a first reset control signal line Rst1 to receive a first sub-reset control signal; the first electrode of the second reset transistor T7 is configured to be electrically connected with a second reset power terminal Vinit2 to receive a second reset signal, the second electrode of the second reset transistor T7 is electrically connected with the first electrode of the organic light emitting element 0220, and the gate electrode of the second reset transistor T7 is configured to be electrically connected with a second reset control signal line Rst2 to receive a second sub-reset control signal; the first electrode of the first light emitting control transistor T4 is electrically connected with the first power terminal VDD, the second electrode of the first light emitting control transistor T4 is electrically connected with the first electrode of the driving transistor T1, and the gate electrode of the first light emitting control transistor T4 is configured to be electrically connected with the a light emitting control signal line EM1 to receive a first light emitting control signal; the first electrode of the second light emitting control transistor T5 is electrically connected with the second electrode of the driving transistor T1, the second electrode of the second light emitting control transistor T5 is electrically connected with the second electrode of the organic light emitting element 0220, and the gate electrode of the second light emitting control transistor T5 is configured to be electrically connected with a second light emitting control signal line EM2 to receive a second light emitting control signal; and the first electrode of the organic light emitting element 0220 is electrically connected with a second power terminal VSS.

For example, one of the first power terminal VDD and the second power terminal VSS is a high voltage terminal, and the other of the first power terminal VDD and the second power terminal VSS is a low voltage terminal. For example, in the embodiment shown in FIG. 8, the first power terminal VDD is a voltage source to output a constant first voltage, and the first voltage is a positive voltage; and the second power terminal VSS can be a voltage source to output a constant second voltage, and the second voltage is a negative voltage, etc. For example, in some examples, the second power terminal VSS can be grounded.

For example, as shown in FIG. 8, the scan signal and the compensation control signal can be the same, that is, the gate electrode of the data writing transistor T2 and the gate electrode of the threshold compensation transistor T3 can be electrically connected with the same signal line, such as the first scan signal line Ga1, to receive the same signal (e.g., the scan signal), and in this case, the display substrate may not be provided with the second scan signal line Ga2, and the number of signal lines can be reduced. For another example, the gate electrode of the data writing transistor T2 and the gate electrode of the threshold compensation transistor T3 may also be respectively electrically connected with different signal lines, that is, the gate electrode of the data writing transistor T2 is electrically connected with the first scan signal line Ga1, the gate electrode of the threshold compensation transistor T3 is electrically connected with the second scan signal line Ga2, and the signals transmitted by the first scan signal line Ga1 and the second scan signal line Ga2 are the same.

It should be noted that the scan signal and the compensation control signal may also be different, so that the gate electrode of the data writing transistor T2 and the gate electrode of the threshold compensation transistor T3 can be controlled separately, which increases the flexibility of controlling the pixel circuit.

For example, as shown in FIG. 8, the first light emitting control signal and the second light emitting control signal can be the same, that is, the gate electrode of the first light emitting control transistor T4 and the gate electrode of the second light emitting control transistor T5 can be electrically connected with the same signal line, such as the first light emitting control signal line EM1, to receive the same signal (e.g., the first light emitting control signal), and in this case, the display substrate may not be provided with the second light emitting control signal line EM2, and the number of signal lines can be reduced. For another example, the gate electrode of the first light emitting control transistor T4 and the gate electrode of the second light emitting control transistor T5 may also be respectively electrically connected with different signal lines, that is, the gate electrode of the first light emitting control transistor T4 is electrically connected with the first light emitting control signal line EM1, the gate electrode of the second light emitting control transistor T5 is electrically connected with the second light emitting control signal line EM2, and the signals transmitted by the first light emitting control signal line EM1 and the second light emitting control signal line EM2 are the same.

It should be noted that in the case where the first light emitting control transistor T4 and the second light emitting control transistor T5 are transistors of different types, for example, the first light emitting control transistor T4 is a P-type transistor and the second light emitting control transistor T5 is an N-type transistor, the first light emitting control signal and the second light emitting control signal can also be different, which is not limited in the embodiment of the present disclosure.

For example, the first sub-reset control signal and the second sub-reset control signal can be the same, that is, the gate electrode of the first reset transistor T6 and the gate electrode of the second reset transistor T7 can be electrically connected with the same signal line, such as the first reset control signal line Rst1, to receive the same signal (e.g., the first sub-reset control signal), and in this case, the display substrate may not be provided with the second reset control signal line Rst2, and the number of signal lines can be reduced. For another example, the gate electrode of the first reset transistor T6 and the gate electrode of the second reset transistor T7 may also be respectively electrically connected with different signal lines, that is, the gate electrode of the first reset transistor T6 is electrically connected with the first reset control signal line Rst1, the gate electrode of the second reset transistor T7 is electrically connected with the second reset control signal line Rst2, and the signals transmitted by the first reset control signal line Rst1 and the second reset control signal line Rst2 are the same. It should be noted that the first sub-reset control signal and the second sub-reset control signal can also be different.

For example, in some examples, the second sub-reset control signal can be the same as the scan signal, that is, the gate electrode of the second reset transistor T7 can be electrically connected with the scan signal line Ga to receive the scan signal as the second sub-reset control signal.

For example, the source electrode of the first reset transistor T6 and the source electrode of the second reset transistor T7 are respectively connected with the first reset power terminal Vinit1 and the second reset power terminal Vinit2, and the first reset power terminal Vinit1 and the second reset power terminal Vinit2 can be DC reference voltage terminals to output a constant DC reference voltage. The first reset power terminal Vinit1 and the second reset power terminal Vinit2 can be the same, and for example, the source electrode of the first reset transistor T6 and the source electrode of the second reset transistor T7 are connected with the same reset power terminal. The first reset power terminal Vinit1 and the second reset power terminal Vinit2 can be high voltage terminals or low voltage terminals, as long as they can provide the first reset signal and the second reset signal to reset the gate electrode of the driving transistor T1 and the first electrode of the organic light emitting element 0220, which is not limited in the present disclosure. For example, the source electrode of the first reset transistor T6 and the source electrode of the second reset transistor T7 can both be connected with a reset power signal line Init.

It should be noted that the driving circuit 0222, the data writing circuit 0226, the storage circuit 0227, the threshold compensation circuit 0228 and the reset circuit 0229 in the pixel circuit shown in FIG. 8 are merely illustrative, and the specific structures of the circuits, such as the driving circuit 0222, the data writing circuit 0226, the storage circuit 0227, the threshold compensation circuit 0228 and the reset circuit 0229, etc., can be set according to actual application requirements, which are not specifically limited in the embodiment of the present disclosure.

For example, according to the characteristics of transistors, the transistors can be divided into N-type transistors and P-type transistors. For the sake of clarity, the embodiment of the present disclosure takes that the transistors are P-type transistors (e.g., P-type MOS transistors) as an example to elaborate the technical solutions of the present disclosure, that is, in the description of the present disclosure, the driving transistor T1, the data writing transistor T2, the threshold compensation transistor T3, the first light emitting control transistor T4, the second light emitting control transistor T5, the first reset transistor T6 and the second reset transistor T6, etc., can all be P-type transistors. However, the transistors in the embodiments of the present disclosure are not limited to P-type transistors, and those skilled in the art can also realize the functions of one or more transistors in the embodiments of the present disclosure by using N-type transistors (e.g., N-type MOS transistors) according to actual needs.

It should be noted that the transistors adopted in the embodiments of the present disclosure can be thin film transistors, field effect transistors or other switching elements with the same characteristics, and the thin film transistors can include oxide semiconductor thin film transistors, amorphous silicon thin film transistors or polysilicon thin film transistors, etc. The source electrode and the drain electrode of the transistor can be symmetrical in structure, so the source electrode and the drain electrode can be indistinguishable in physical structure. In the embodiments of the present disclosure, in order to distinguish the electrodes of a transistor, except for the gate electrode serving as the control terminal, it is directly described that one of them is the first electrode and the other is the second electrode, so the first electrode and the second electrode of all or part of the transistors in the embodiment of the present disclosure can be interchanged as needed.

It should be noted that, in the embodiment of the present disclosure, the pixel circuit of a sub-pixel can not only be the 7T1C structure (i.e., seven transistors and one capacitor) shown in FIG. 8, but also be a structure including other numbers of transistors, such as a 7T2C structure, a 6T1C structure, a 6T2C structure or a 9T2C structure, without being limited in the embodiment of the present disclosure.

Figure 9A:
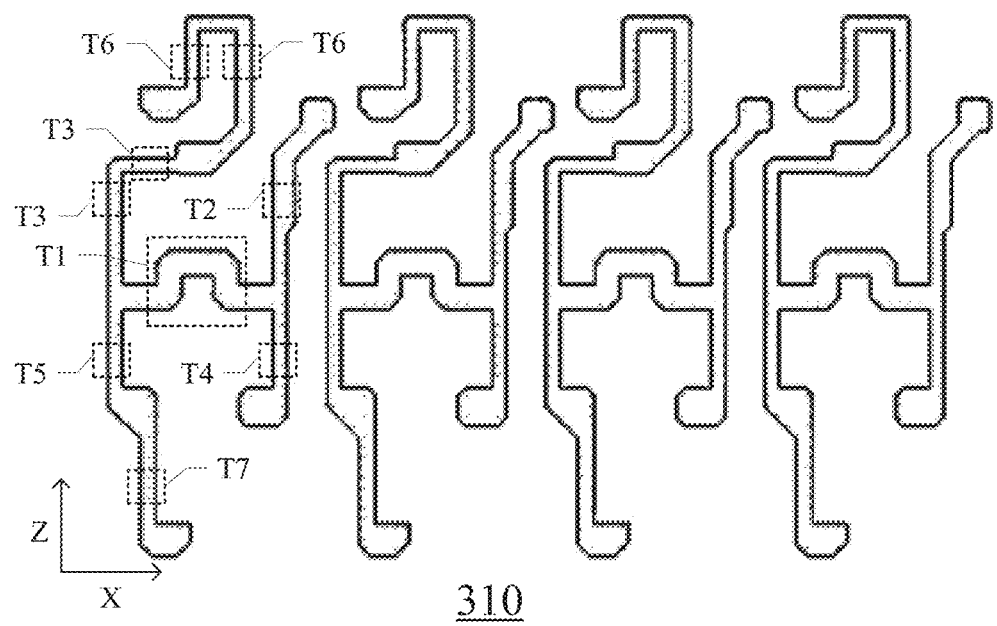
FIGS. 9A-9E and 10 are schematic diagrams of layers of a pixel circuit provided by an embodiment of the present disclosure.

FIGS. 9A-9E and 10 are schematic diagrams of layers of a pixel circuit provided by some embodiments of the present disclosure. Hereinafter, the positional relationship of each circuit in the pixel circuit on the backplane will be described with reference to FIGS. 9A-9E and 10. The example shown in FIGS. 9A-9E and 10 takes the pixel circuits 0221 of four adjacent sub-pixels as an example, and illustrates the positions of the transistors of the pixel circuit included in one sub-pixel, and the positions of the components included in the pixel circuits of other sub-pixels are approximately the same as the positions of the transistors included in this sub-pixel. As shown in FIG. 9A, the pixel circuit 0221 of the sub-pixel includes the driving transistor T1, the data writing transistor T2, the threshold compensation transistor T3, the first light emitting control transistor T4, the second light emitting control transistor T5, the first reset transistor T6, the second reset transistor T7 and the capacitor C shown in FIG. 8.

For example, FIG. 9A shows the active semiconductor layer 310 of the pixel circuit in the display substrate. The active semiconductor layer 310 can be formed by patterning a semiconductor material. The active semiconductor layer 310 can be used to manufacture the active layers of the driving transistor T1, the data writing transistor T2, the threshold compensation transistor T3, the first light emitting control transistor T4, the second light emitting control transistor T5, the first reset transistor T6 and the second reset transistor T7 described above. The active semiconductor layer 310 includes active layer patterns (channel regions) and doped region patterns (source-drain doped regions) of the transistors of each sub-pixel, and the active layer patterns and doped region patterns of the transistors in the same pixel circuit are integrated.

It should be noted that the active layer can include an integrally formed low-temperature poly-silicon layer, and the source region and the drain region can be conductive by means of doping, etc., to realize the electrical connection of the structures. That is, the active semiconductor layer of the transistors in each sub-pixel is an integral pattern formed by P-silicon, and the transistors in the same pixel circuit include the doped region patterns (i.e., source regions and drain regions) and the active layer patterns, and the active layers of different transistors are separated by doped structures.

For example, the active semiconductor layer 310 can be made of amorphous silicon, poly-silicon, oxide semiconductor materials, etc. It should be noted that the source region and the drain region can be regions doped with N-type impurities or P-type impurities.

For example, the active semiconductor layers in the pixel circuits of sub-pixels of different colors arranged along the first direction are disconnected from each other without a connection relationship. The active semiconductor layers in the pixel circuits of the sub-pixels arranged along the second direction can be integrally arranged or disconnected from each other.

FIGS. 9A-9E and 10 also show scan signal lines Ga (including the first scan signal line Ga1 and the second scan signal line Ga2), reset control signal lines Rst (including the first reset control signal line Rst1 and the second reset control signal line Rst2), reset power signal lines Init serving as the reset power terminals Vinit (including the first reset power signal line Init1 serving as the first reset power terminal Vinit1 and the second reset power signal line Init2 serving as the second reset power terminal Vinit2), light emitting control signal lines EM (including the first light emitting control signal line EM1 and the second light emitting control signal line EM2), data lines Vd and power signal lines VDD (including the first power signal line VDD1 and the second power signal line VDD2). The first power signal line VDD1 and the second power signal line VDD2 are electrically connected with each other.

It should be noted that in the example shown in FIGS. 9A-9E and 10, the first scan signal line Ga1 and the second scan signal line Ga2 are the same scan signal line Ga, the first reset power signal line Init1 and the second reset power signal line Init2 are the same reset power signal line Init, the first reset control signal line Rst1 and the second reset control signal line Rst2 are the same reset control signal line Rst, and the first light emitting control signal line EM1 and the second light emitting control signal line EM2 are the same light emitting control signal line EM, which are not limited thereto.

Figure 9B:
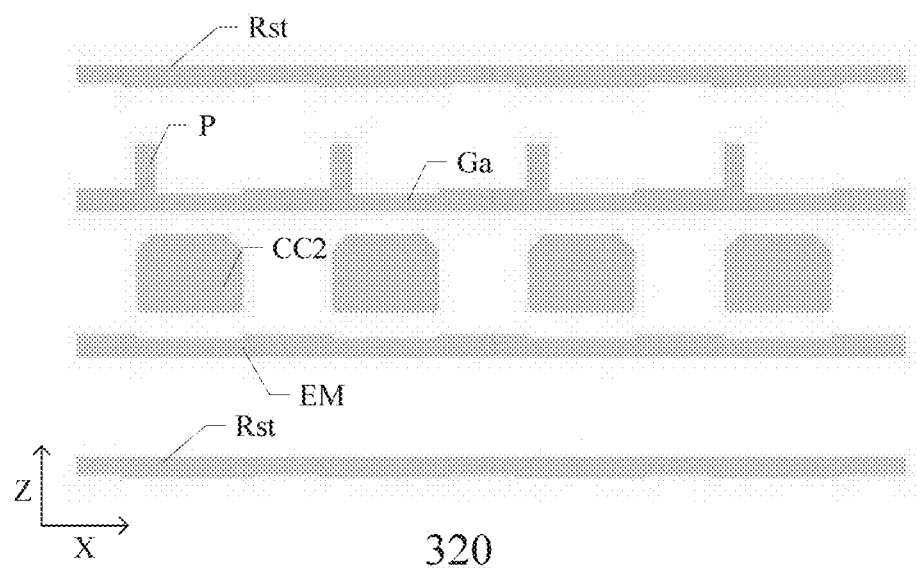

For example, the gate metal layer of the pixel circuit can include a first conductive layer and a second conductive layer. A gate insulating layer (the gate insulating layer 160 shown in FIG. 7A) is formed on the active semiconductor layer 310 to insulate the active semiconductor layer 310 from the gate metal layer subsequently formed. FIG. 9B shows the first conductive layer 320 included in the display substrate, the first conductive layer 320 is disposed at a side of the gate insulating layer away from the active semiconductor layer 310, so as to be insulated from the active semiconductor layer 310. The first conductive layer 320 can include the second electrode CC2 of the capacitor C, the scan signal line Ga, the reset control signal line Rst, the light emitting control signal line EM, and the gate electrodes of the driving transistor T1, the data writing transistor T2, the threshold compensation transistor T3, the first light emitting control transistor T4, the second light emitting control transistor T5, the first reset transistor T6 and the second reset transistor T7.

For example, as shown in FIG. 9B, the gate electrode of the data writing transistor T2 can be a portion of the scan signal line Ga overlapped with the active semiconductor layer 310; the gate electrode of the first light emitting control transistor T4 can be a first portion of the light emitting control signal line EM overlapped with the active semiconductor layer 310, and the gate electrode of the second light emitting control transistor T5 can be a second portion of the light emitting control signal line EM overlapped with the active semiconductor layer 310; the gate electrode of the first reset transistor T6 can be a first portion of the reset control signal line Rst overlapped with the active semiconductor layer 310, and the gate electrode of the second reset transistor T7 can be a second portion of the reset control signal line Rst overlapped with the active semiconductor layer 310; the threshold compensation transistor T3 can be a thin film transistor with a dual-gate structure, the first gate electrode of the threshold compensation transistor T3 can be a portion of the scan signal line Ga overlapped with the active semiconductor layer 310, and the second gate electrode of the threshold compensation transistor T3 can be a portion, overlapped with the active semiconductor layer 310, of a protruding structure P protruding from the scan signal line Ga. As shown in FIG. 8 and FIG. 9B, the gate electrode of the driving transistor T1 can be the second electrode CC2 of the capacitor C.

It should be noted that the dashed rectangular frames in FIG. 9A show the portions of the first conductive layer 320 overlapped with the active semiconductor layer 310. In terms of the channel region of each transistor, the active semiconductor layers located on both sides of the channel region are conductive by means of ion doping, etc., so as to form the first electrode and the second electrode of the each transistor.

For example, as shown in FIG. 9B, the scan signal line Ga, the reset control signal line Rst and the light emitting control signal line EM are arranged along the second direction Z. The scan signal line Ga is located between the reset control signal line Rst and the light emitting control signal line EM.

For example, in the second direction Z, the second electrode CC2 of the capacitor C (i.e., the gate electrode of the driving transistor T1) is located between the scan signal line Ga and the light emitting control signal line EM. The protruding structure P protruding from the scan signal line Ga is located at a side of the scan signal line Ga away from the light emitting control signal line EM.

For example, as shown in FIGS. 9A-9B, in the second direction Z, the gate electrode of the data writing transistor T2, the gate electrode of the threshold compensation transistor T3 and the gate electrode of the first reset transistor T6 are all located at a first side of the gate electrode of the driving transistor T1, and the gate electrode of the first light emitting control transistor T4, the gate electrode of the second light emitting control transistor T5 and the gate electrode of the second reset transistor T7 are all located at a second side of the gate electrode of the driving transistor T1. For example, in the example shown in FIGS. 9A-9B, the first side and the second side of the gate electrode of the driving transistor T1 in the pixel circuit of the sub-pixel are opposite sides of the gate electrode of the driving transistor T1 in the second direction Z. For example, as shown in FIGS. 9A-9B, in the XZ plane, the first side of the gate electrode of the driving transistor T1 in the pixel circuit of the sub-pixel can be the upper side of the gate electrode of the driving transistor T1, and the second side of the gate electrode of the driving transistor T1 in the pixel circuit of the sub-pixel can be the lower side of the gate electrode of the driving transistor T1. In terms of the lower side, for example, one side of the display substrate for bonding an IC is the lower side of the display substrate, and the lower side of the gate electrode of the driving transistor T1 is one side of the gate electrode of the driving transistor T1 closer to the IC. The upper side is the opposite side of the lower side, and for example, the upper side is one side of the gate electrode of the driving transistor T1 away from the IC.

For example, in some embodiments, as shown in FIGS. 9A-9B, in the first direction X, the gate electrode of the data writing transistor T2 and the gate electrode of the first light emitting control transistor T4 are located at a third side of the gate electrode of the driving transistor T1, and the first gate electrode of the threshold compensation transistor T3, the gate electrode of the second light emitting control transistor T5 and the gate electrode of the second reset transistor T7 are all located at a fourth side of the gate electrode of the driving transistor T1. For example, in the example shown in FIGS. 9A-9B, the third side and the fourth side of the gate electrode of the driving transistor T1 in the pixel circuit of the sub-pixel are opposite sides of the gate electrode of the driving transistor T1 in the first direction X. For example, as shown in FIGS. 9A-9B, the third side of the gate electrode of the driving transistor T1 in the pixel circuit can be the right side of the gate electrode of the driving transistor T1 in the pixel circuit, and the fourth side of the gate electrode of the driving transistor T1 in the pixel circuit can be the left side of the gate electrode of the driving transistor T1 in the pixel circuit. The left side and the right side are opposite sides, and for example, in terms of the data line Vd and the first power signal line VDD1 connected with the same pixel circuit, the data line Vd is at the right side of the first power signal line VDD1, and the first power signal line VDD1 is at the left side of the data line Vd.

It should be noted that the structure of each pixel circuit can be a mirror structure with respect to the structure shown in FIGS. 9A-9E and 10. That is, in terms of each layer structure of each pixel circuit, based on the channel region of the driving transistor T1, the structures on the left and right sides of the channel region of the driving transistor T1 are reversed, and therefore, the above-mentioned relationship between the left and right sides can be reversed.

Figure 9C:
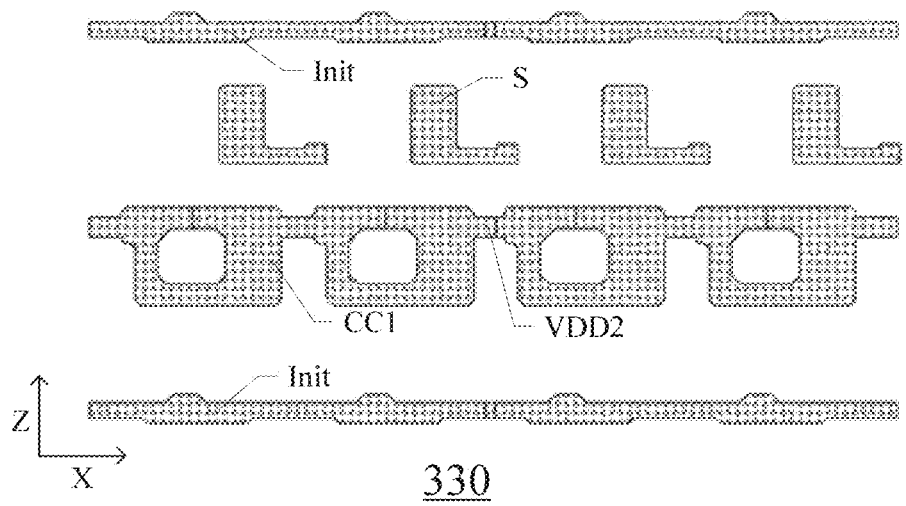

For example, a first insulating layer (e.g., the first insulating layer 150 shown in FIG. 7A) is formed on the first conductive layer 320 to insulate the first conductive layer 320 from the second conductive layer 330 subsequently formed. FIG. 9C shows the second conductive layer 330 of the pixel circuit, the second conductive layer 330 includes the first electrode CC1 of the capacitor C, the reset power signal line Init, the second power signal line VDD2, and the light shielding portion S. The second power signal line VDD2 and the first electrode CC1 of the capacitor C can be integrally formed, and a plurality of first power signal lines VDD1 (to be described later) extending in the Z direction are communicated through the second power signal line VDD2 and the first electrode CC1 of the capacitor C, so as to form a meshed wiring to reduce resistance. The first electrode CC1 of the capacitor C is at least partially overlapped with the second electrode CC2 of the capacitor C to form the capacitor C.

For example, as shown in FIG. 9C, the active semiconductor layer between the two channels of the dual-gate threshold compensation transistor T3 is in a floating state when the threshold compensation transistor T3 is turned off, and is easily affected by the voltages of the surrounding lines and jumps, thus affecting the leakage current of the threshold compensation transistor T3, and further affecting the luminous brightness. In order to keep the voltage of the active semiconductor layer between the two channels of the threshold compensation transistor T3 stable, the light shielding portion S is designed to form a capacitor with the active semiconductor layer between the two channels of the threshold compensation transistor T3, and the light shielding portion S can be connected with the first power signal line VDD1 to obtain a constant voltage, so that the voltage of the active semiconductor layer in the floating state can be kept stable. The light shielding portion S is overlapped with the active semiconductor layer between the two channels of the dual-gate threshold compensation transistor T3, which can also prevent the active semiconductor layer between the two gate electrodes from being illuminated to change its characteristics, and for example, prevent the voltage of this part of the active semiconductor layer from changing, so as to avoid crosstalk.

Figure 9D:
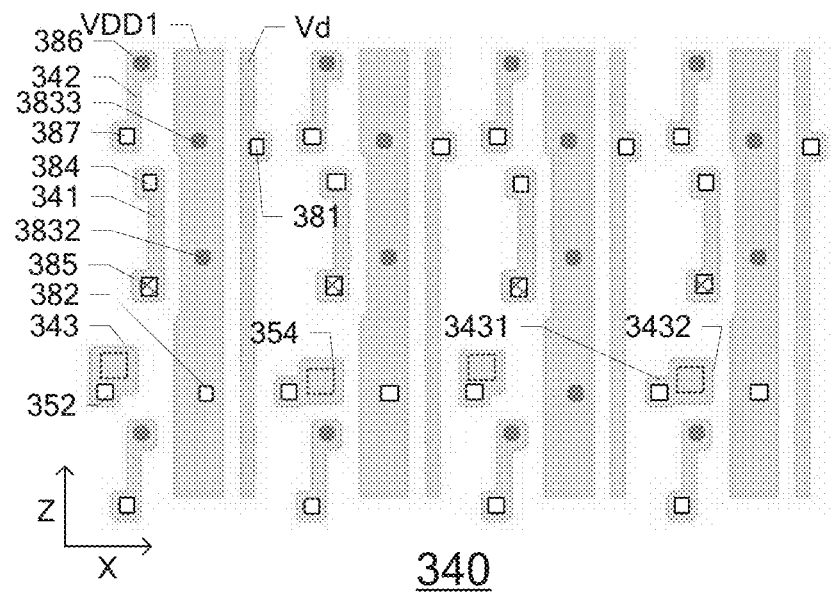

For example, a second insulating layer (e.g., the second insulating layer 140 shown in FIG. 7A) is formed on the second conductive layer 330 to insulate the second conductive layer 330 from the source-drain metal layer 340 subsequently formed. FIG. 9D shows the source-drain metal layer 340 of the pixel circuit, the source-drain metal layer 340 includes the data line Vd and the first power signal line VDD1. Both the data line Vd and the first power signal line VDD1 extend along the Z direction.

For example, the source-drain metal layer 340 further includes a first connection portion 341, a second connection portion 342 and a third connection portion 343. FIG. 9D further shows exemplary positions of a plurality of via holes, and the source-drain metal layer 340 is connected with a plurality of film layers between the source-drain metal layer 340 and the base substrate through the plurality of via holes. As shown in FIG. 9D, different color filled via holes indicate that the source-drain metal layers 340 is connected with different film layers through these different color filled via holes. For example, a white filled via hole indicates that the source-drain metal layer 340 is connected with the active semiconductor layer 310 shown in FIG. 9A through the white filled via hole, a black filled via hole indicates that the source-drain metal layer 340 is connected with the second conductive layer 330 shown in FIG. 9C through the black filled via hole, and a via hole 385 indicates that the source-drain metal layer 340 is connected with the first conductive layer 320 shown in FIG. 9B through the via hole 385.

For example, as shown in FIG. 7A and FIGS. 9A-9D, the data line Vd is electrically connected with the second electrode of the data writing transistor T2 through a via hole 381 penetrating through the gate insulating layer 160, the first insulating layer 150 and the second insulating layer 140. The first power signal line VDD1 is electrically connected with the first electrode of the first light emitting control transistor T4 through a via hole 382 penetrating through the gate insulating layer 160, the first insulating layer 150 and the second insulating layer 140. The first power signal line VDD1 and the data line Vd are alternately arranged along the first direction. The first power signal line VDD1 is electrically connected with the second power signal line VDD2 (the first electrode CC1 of the storage capacitor) through a via hole 3832 penetrating through the second insulating layer 140. The first power signal line VDD1 extends along the second direction Z, and the second power signal line VDD2 extends along the first direction X. The first power signal line VDD1 and the second power signal line VDD2 are in a meshed wiring on the display substrate. That is to say, the first power signal line VDD1 and the second power signal line VDD2 are arranged in a meshed way on the entire display substrate, so that the resistance of the signal line of the power terminal VDD is small and the voltage drop thereof is low, thereby improving the stability and uniformity of the power voltage provided by the power terminal VDD. The first power signal line VDD1 is electrically connected with the light shielding portion S through a via hole 3833 penetrating through the second insulating layer to provide a constant voltage to the light shielding portion S. One end of the first connection portion 341 is electrically connected with the second electrode of the threshold compensation transistor T3 through a via hole 384 penetrating through the gate insulating layer 160, the first insulating layer 150 and the second insulating layer 140, and the other end of the first connection portion 341 is electrically connected with the gate electrode of the driving transistor T1 (i.e., the second electrode CC2 of the capacitor C) through a via hole 385 penetrating through the first insulating layer 150 and the second insulating layer 140. One end of the second connection portion 342 is electrically connected with the reset power signal line Init through a via hole 386 penetrating through the second insulating layer 140, and the other end of the second connection portion 342 is electrically connected with the first electrode of the second reset transistor T7 through a via hole 387 penetrating through the gate insulating layer 160, the first insulating layer 150 and the second insulating layer 140. The third connection portion 343 includes a first part 3431 and a second part 3432, and the first part 3431 of the third connection portion 343 is electrically connected with the second electrode of the second light emitting control transistor T5 through a via hole 352 penetrating through the gate insulating layer 160, the first insulating layer 150 and the second insulating layer 140.

For example, a planarization layer (e.g., the planarization layer 120 shown in FIG. 7A) is formed on the source-drain metal layer 340 to protect the source-drain metal layer 340. As shown in FIG. 9D, the planarization layer 120 includes a via hole 354, and the second electrode of the organic light emitting element of each sub-pixel can be disposed on one side of the planarization layer 120 away from the base substrate 100, and the second electrode of the organic light emitting element is electrically connected with the second part 3432 of the third connection portion 343 through the via hole 354 to realize electrical connection with the second electrode of the second light emitting control transistor T5.

Figure 7B:
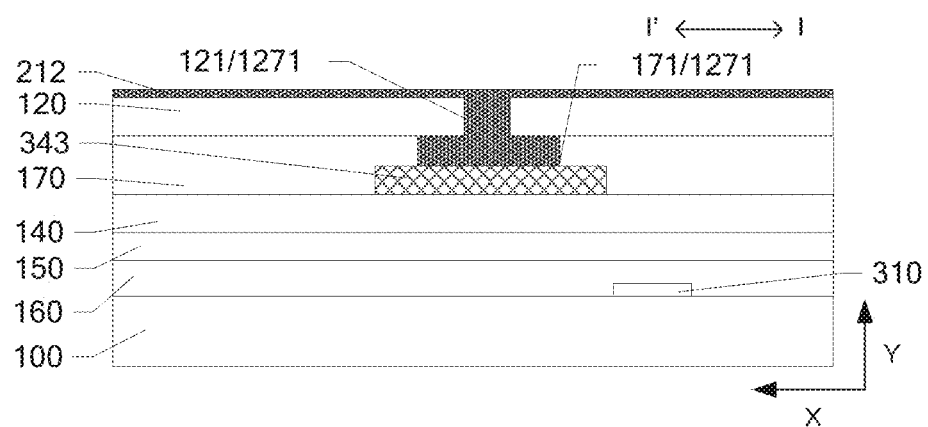
FIG. 7B is a partial cross-sectional structural view of a display substrate in an example taken along line II' shown in FIG. 6.

For example, FIG. 7B is a partial cross-sectional structural view taken along line II' shown in FIG. 6 in an example of the embodiment of the present disclosure. As shown in FIG. 7B, a passivation layer 170 is further disposed between the planarization layer 120 and the third connection portion 343. The passivation layer 170 can be disposed at the position of the power signal line located at the intersection between the peripheral region and the display region, so as to protect the source-drain metal layer 340. The passivation layer 170 can be an inorganic layer, the planarization layer 120 can be an organic layer, and the thickness of the organic layer is greater than the thickness of an inorganic layer, such as the thickness of the passivation layer, etc.

For example, as shown in FIG. 7B, the second electrode 212 of the organic light emitting element of the first color sub-pixel is connected with the third connection portion 343 through a nested via hole 1271 (i.e., the via hole 354) located in the planarization layer 120 and the passivation layer 170, so as to realize connection with the second light emitting control transistor. Similarly, the second electrode of the organic light emitting element of the second color sub-pixel and the second electrode of the organic light emitting element of the third color sub-pixel can be connected with the corresponding third connection portions through nested via holes located in the planarization layer and the passivation layer. For example, the nested via hole 1271 includes a via hole 121 in the planarization layer 120 and a via hole 171 in the passivation layer 170, the via hole 121 in the planarization layer 120 is opposite to the via hole 171 in the passivation layer 170, and the orthographic projection of the via hole 121 in the planarization layer 120 on the base substrate 100 is within the orthographic projection of the via hole 171 in the passivation layer 170 on the base substrate 100. Of course, the embodiments of the present disclosure are not limited thereto. For example, the position of the planarization layer 120 and the position of the passivation layer 170 can be interchanged, that is, the passivation layer can be located on one side of the planarization layer away from the source-drain metal layer, or only the planarization layer is provided while the passivation layer is not provided.

Figure 9E:
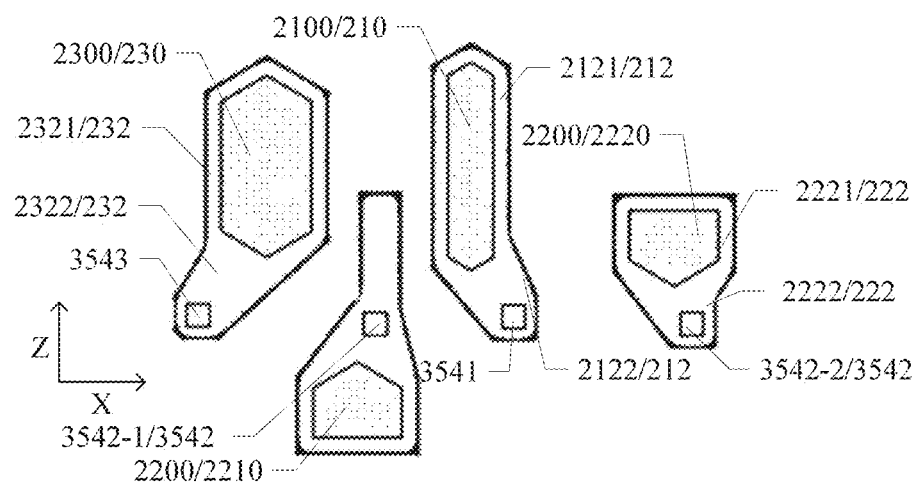

FIG. 9E is a planar view of organic light emitting elements in one-to-one correspondence with the pixel circuit structures shown in FIGS. 9A-9D. As shown in FIGS. 5-6 and FIGS. 9A-9E, the second electrode 212 of the first color sub-pixel includes a first main body electrode 2121 and a first connection electrode 2122, the first main body electrode 2121 and the first connection electrode 2122 can be integrated, and the first connection electrode 2122 is connected with the second part 3432 of the third connection portion through a first via hole 3541 to realize connection with the second electrode of the second light emitting control transistor T5 of the first color sub-pixel. The second electrode 222 of each second color sub-pixel in the second color sub-pixel pair 220 includes a second main body electrode 2221 and a second connection electrode 2222, the second main body electrode 2221 and the second connection electrode 2222 can be integrated, and the second connection electrode 2222 of the second color sub-pixel is connected with the second part 3432 of the third connection portion 343 through a second via hole 3542 to realize connection with the second electrode of the second light emitting control transistor T5 of the second color sub-pixel. The second electrode 232 of the third color sub-pixel 230 includes a third main body electrode 2321 and a third connection electrode 2322, the third main body electrode 2321 and the third connection electrode 2322 can be integrated, and the third connection electrode 2322 is connected with the second part 3432 of the third connection portion 343 through a third via hole 3543 to realize connection with the second electrode of the second light emitting control transistor T5 of the third color sub-pixel 130.

For example, as shown in FIGS. 5-6 and FIG. 9E, the shape of the main body electrode of each sub-pixel is approximately the same as the shape of the light emitting region of the each sub-pixel. For example, the first main body electrode 2121 of the first color sub-pixel 210 and the third main body electrode 2321 of the third color sub-pixel 230 are approximately hexagonal or elliptical in shape, and the second main body electrode 2221 of each second color sub-pixel 2210 or 2220 in the second color sub-pixel pair 220 is approximately pentagonal, circular or droplet-shaped.

For example, in the first color sub-pixel 210, the center of the light emitting region 2100 basically coincides with the geometric center of the shape of the first main body electrode 2121, and the center line of the light emitting region 2100 extending along the second direction basically coincides with the center line of the first main body electrode 2121 extending along the second direction, and therefore, the geometric center of the shape of the first main body electrode 2121 is the center of the first color sub-pixel 210. In the second color sub-pixel pair 220, the center of the light emitting region 2200 basically coincides with the geometric center of the shape of the second main body electrode 2221, and the center line of the light emitting region 2200 extending along the second direction basically coincides with the center line of the second main body electrode 2221 extending along the second direction, and therefore, the midpoint of the connection line between the geometric centers of two second main body electrodes 2221 included in the second color sub-pixel pair 220 is the center of the second color sub-pixel pair 220. In the third color sub-pixel 230, the center of the light emitting region 2300 basically coincides with the geometric center of the shape of the third main body electrode 2321, and the center line of the light emitting region 2300 extending along the second direction basically coincides with the center line of the third main body electrode 2321, and therefore, the geometric center of the shape of the third body electrode 2321 is the center of the third color sub-pixel 230. In each repeating unit 200, the distance, along the first direction, between the center of the third main body electrode 2321 and the center of the second main body electrode 2221 can be the first distance. The distance, along the first direction, between the center of the third main body electrode 2321 in the first repeating unit 201 and the center of the second main body electrode 2221 in the third repeating unit 203 can be the second distance. The distance, along the first direction, between the center of the first main body electrode 2121 in the second repeating unit 202 and the center of the second main body electrode 2221 in the third repeating unit 203 can be the third distance. In each repeating unit 200, the distance, along the first direction, between the center of the first main body electrode 2121 and the center of the second main body electrode 2221 can be the fourth distance.

For example, as shown in FIGS. 9D-9E, the fourth via holes 352 in the pixel circuits arranged in the X direction are located on a straight line extending in the X direction, and are arranged at equal intervals.

For example, the fourth via hole 352 of the second color sub-pixel is not overlapped with the light emitting region of the second color sub-pixel, the fourth via hole 352 of the second color sub-pixel is located at a side of the second via hole 3542 of the second color sub-pixel close to the first via hole 3541 of the first color sub-pixel 310, and the orthographic projections of the fourth via hole 352 and the second via hole 3542 of the second color sub-pixel on a straight line extending along the second direction are overlapped with each other. Therefore, the position of the second via hole 3542 in the planarization layer is not greatly adjusted in the second direction (Z direction) relative to the position of the fourth via hole 352 penetrating through the gate insulating layer, the first insulating layer and the second insulating layer, so that the influence on the overall pixel circuit structure can be reduced. For example, the fourth via hole 352 and the second via hole 3542 of the second color sub-pixel are arranged in the first direction.

For example, in two second color sub-pixels included in the second color sub-pixel pair 220, the relative positional relationship between the second via hole 3452 and the fourth via hole 352 corresponding to the same sub-pixel is the same. For example, in the two second color sub-pixels included in the second color sub-pixel pair 220, two second via holes corresponding to the two second color sub-pixels are located on a straight line extending along the second direction, and two fourth via holes corresponding to the two second color sub-pixels are located on another straight line extending along the second direction, and these two straight lines do not coincide.

For example, the fourth via hole 352 of the first color sub-pixel 210 is not overlapped with the light emitting region of the first color sub-pixel 210, the fourth via hole 352 of the first color sub-pixel is located at a side of the first via hole 3541 of the first color sub-pixel away from the light emitting region of the first color sub-pixel, and the orthographic projections of the fourth via hole 352 and the first via hole 3541 on a straight line extending along the first direction are overlapped with each other. For example, the fourth via hole and the first via hole of the first color sub-pixel are arranged in the second direction.

For example, the fourth via hole 352 of the third color sub-pixel 230 is not overlapped with the light emitting region of the third color sub-pixel 230, the fourth via hole 352 of the third color sub-pixel is located at a side of the third via hole 3543 of the third color sub-pixel 230 away from the light emitting region of the third color sub-pixel 230, and the orthographic projections of the fourth via hole 352 and the third via hole 3543 on a straight line extending along the first direction are overlapped with each other. For example, the fourth via hole and the third via hole of the third color sub-pixel are arranged in the second direction.

Figure 10:
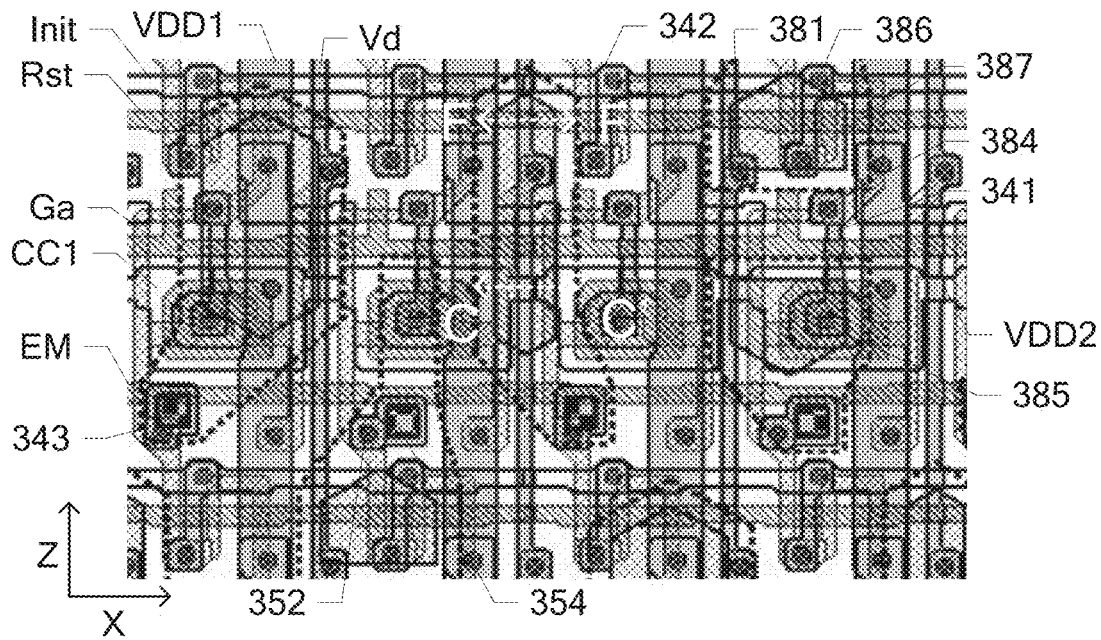

FIG. 10 is a planar view of a stack of various film layers shown in FIGS. 9A-9E. As shown in FIGS. 9E-10, for example, the first connection electrode 2122 of the first color sub-pixel 210 is located at a side of the center of the first main body electrode 2121 away from the reset control signal line Rst connected with the pixel circuit of the sub-pixel of the first color sub-pixel in the Z direction, and is located at a side of the center of the first main body electrode 2121 close to the data line Vd connected with the pixel circuit of the sub-pixel of the first color sub-pixel in the X direction. For example, the first connection electrode 2122 and the first main body electrode 2121 of the first color sub-pixel 210 are arranged in the Z direction, and the first connection electrode 2122 is located at the lower right corner of the first main body electrode 2121. For example, two second connection electrodes 2222 in the second color sub-pixel pair 220 are located at both sides of two second main body electrodes 2221 in the Z direction. For example, the two second connection electrodes 2222 and the two second body electrodes 2221 of the second color sub-pixel pair 220 are arranged in the Z direction; in one second color sub-pixel, the second connection electrode is located at the upper right corner of the second main body electrode 2221; and in the other second color sub-pixel, the second connection electrode is located at the lower right corner of the second main body electrode 2221. For example, the third connection electrode 2322 of the third color sub-pixel 230 is located at a side of the center of the third main body electrode 2321 away from the reset control signal line Rst connected with the pixel circuit of the sub-pixel of the third color sub-pixel in the Z direction, and is located at a side of the center of the third main body electrode 2321 close to the first power signal line VDD1 connected with the pixel circuit of the sub-pixel of the third color sub-pixel in the X direction. For example, the third connection electrode 2322 and the third main body electrode 2321 of the third color sub-pixel 230 are arranged in the Z direction, and the third connection electrode 2322 is located at the lower left corner of the third main body electrode 2321.

For example, the orthographic projection of the opening of the pixel defining layer on the base substrate is located within the orthographic projection of the main body electrode of a corresponding second electrode on the base substrate.

For example, the orthographic projection of the opening of the pixel defining layer on the base substrate is located within the orthographic projection of a corresponding light emitting layer on the base substrate, that is, the light emitting layer covers the opening of the pixel defining layer. For example, the area of the light emitting layer is greater than the area of the corresponding opening of the pixel defining layer, that is, the light emitting layer further includes at least a part covering the concrete structure of the pixel defining layer in addition to a part located at the inner side of the opening of the pixel defining layer, and the light emitting layer usually covers the concrete structure of the pixel defining layer at each boundary of the opening of the pixel defining layer. It should be noted that the above description of the light emitting layer pattern is based on, for example, the organic light emitting layer of each sub-pixel which is patterned by a fine metal mask (FMM) process. Besides the FMM manufacturing process, there are also some light emitting layers which use an open mask process to form an entire film layer in the whole display region, and the orthographic projection of the shape of the light emitting layer on the base substrate is continuous, so there are a part located in the opening of the pixel defining layer and a part located on the concrete structure of the pixel defining layer.

For example, as shown in FIGS. 5-6 and FIGS. 9E-10, in the first color sub-pixel 210, the second electrode 212 is connected with a corresponding light emitting control transistor (i.e., the second light emitting control transistor T5) through the first via hole 3541 located in the planarization layer; in the second color sub-pixel pair 220, the two second electrodes 222 of the two second color sub-pixels are connected with two corresponding second light emitting control transistors T5 through two second via holes 3542 located in the planarization layer, respectively; and in the third color sub-pixel 230, the second electrode 232 is connected with a corresponding second light emitting control transistor T5 through the third via hole 3543 located in the planarization layer.

In the embodiment of the present disclosure (as shown in FIGS. 5-6 and FIGS. 9A-9E), among the first color sub-pixel 210, one second color sub-pixel of the second color sub-pixel pair 220 and the third color sub-pixel 230 in each repeating unit 200, the via holes 352 connecting the first parts 3431 of the third connection portions 343 with the second light emitting control transistors T5 are located on a straight line extending along the first direction, and the distance between two adjacent via holes 352 along the first direction is the width of a sub-pixel. That is, among the first color sub-pixel 210, one second color sub-pixel of the second color sub-pixel pair 220 and the third color sub-pixel 230 in each repeating unit 200, the first parts 3431 of the third connection portions 343 are located on a straight line extending along the first direction.

In the pixel arrangement structure shown in FIG. 3, the light emitting region of the green sub-pixel 23 overlaps with the first part 291 of the third connection portion, and the position of the via hole in the planarization layer is greatly adjusted along the Z direction relative to the position of the via hole connecting the second electrode of the second light emitting control transistor with the first part of the third connection portion. Compared with the above case shown in FIG. 3, the embodiment of the present disclosure, by designing the shape of each sub-pixel and the distance between the centers of the sub-pixels along the first direction, the distance between the light emitting region of each sub-pixel and the via hole connecting the third connection portion with the second light emitting control transistor is relatively larger (that is, the distance between the light emitting region of each sub-pixel and the first part of the third connection portion is relatively large); that is to say, the light emitting region is not overlapped with the first part of the third connection portion, and in the case where a via hole used for connecting the second electrode of the organic light emitting element with the third connection portion (i.e., the second part of the third connection portion) is provided in the planarization layer, the position of the via hole can be arranged close to the via hole used for connecting the third connection portion with the second light emitting control transistor, and the two via holes are not opposite to each other. For example, in any one second color sub-pixel of the second color sub-pixel pair, the second via hole connecting the second electrode of the organic light emitting element with the third connection portion is overlapped with the fourth via hole connecting the third connection portion with the second light emitting control transistor in the Z direction, and the position of the via hole in the planarization layer does not need to be greatly adjusted along the Z direction, which can reduce the influence on the overall pixel circuit structure and avoid the occurrence of color cast as much as possible.

For example, as shown in FIGS. 5-6 and FIGS. 9A-9E, in each repeating unit 200, the two second via holes 3542 include a first sub-via hole 3542-1 and a second sub-via hole 3542-2; the first via hole 3541, the second sub-via hole 3542-2 and the third via hole 3543 in the first repeating unit 201, as well as the first sub-via hole 3542-1 in the third repeating unit 203, are basically located on a first straight line extending along the first direction.

For example, as shown in FIGS. 5-6 and FIG. 9D, among the first color sub-pixel 210, one second color sub-pixel of the second color sub-pixel pair 220 and the third color sub-pixel 230 in each repeating unit 200, the via holes 352 connecting the third connection portions 343 with the second light emitting control transistors T5 are located on a second straight line extending along the first direction, and the distance between the second straight line and the first straight line is relatively small, so that the influence on the overall pixel circuit structure can be reduced and the stability of the process is high.

For example, as shown in FIGS. 5-6, along the second direction, in the second color sub-pixel pair 220, the two light emitting regions 2200 included in the two second color sub-pixels are located between the first sub-via hole 3542-1 and the second sub-via hole 3542-2, thus preventing the light emitting regions of the second color sub-pixels from being overlapped with the first part of the third connection portion. For example, along the second direction, in the second color sub-pixel pair 220, the centers of the two light emitting regions 2200 included in the two second color sub-pixels are basically located on the same straight line, and the first sub-via hole 3542-1 and the second sub-via hole 3542-2 of the two second color sub-pixels are basically located on the same straight line which does not coincide with the straight line where the centers of the two light emitting regions 2200 are located. For example, the straight line, where the first sub-via hole 3542-1 and the second sub-via hole 3542-2 of the two second color sub-pixels are located, is located at a side of the straight line, where the centers of the two light emitting regions 2200 are located, close to the first color sub-pixel.

For example, as shown in FIGS. 5-6 and FIGS. 9E-10, in the same repeating unit 200, the first via hole 3541 of the first color sub-pixel 210 is located at a side of a line close to the second color sub-pixel pair 220, and the line is the center line extending along the second direction of the light emitting region of the first color sub-pixel 210. The third via hole 3543 of the third color sub-pixel 230 is located at a side of a line close to the second color sub-pixel pair 220, and the line is the center line extending along the second direction of the light emitting region of the third color sub-pixel 230. For example, in the same repeating unit 200, the first via hole 3541 of the first color sub-pixel 210 is located at the lower right corner of the second electrode 212 of the first color sub-pixel 210, and the third via hole 3543 of the third color sub-pixel 230 is located at the lower left corner of the second electrode 232 of the third color sub-pixel 230. For example, in terms of the above-mentioned "lower left corner" and "lower right corner", based on the channel region of the driving transistor T1, the relationship between the above-mentioned "left" and "right" can be reversed after the structures on the left and right sides of the channel region of the driving transistor T1 are reversed.

For example, in each repeating unit 200, the first sub-via hole 3542-1 of one second color sub-pixel of the second color sub-pixel pair 220 is located at a side of a line close to the third color sub-pixel 230, and the line is the center line extending along the second direction of the light emitting region of the one second color sub-pixel. The second sub-via hole 3542-2 of the other second color sub-pixel of the second color sub-pixel pair 220 is located at a side of a line close to the third color sub-pixel 230, and the line is the center line extending along the second direction of the light emitting region of the other second color sub-pixel. For example, in each repeating unit 200, the first sub-via hole 3542-1 of one second color sub-pixel of the second color sub-pixel pair 220 is located at the upper right corner of the second electrode of the one second color sub-pixel, and the second sub-via hole 3542-2 of the other second color sub-pixel of the second color sub-pixel pair 220 is located at the lower right corner of the second electrode of the other second color sub-pixel.

For example, in each repeating unit 200, the second sub-via hole 3542-2 of the second color sub-pixel pair 220 and the third via hole 3543 of the third color sub-pixel 230 are close to each other. For example, in the same repeating unit group 2000, the third via hole 3543 of the third color sub-pixel 230 in the first repeating unit 201 and the first via hole 3541 of the first color sub-pixel 210 in the second repeating unit 202 are away from each other. For example, in adjacent repeating unit groups 2000, the third via hole 3543 of the third color sub-pixel 230 in the first repeating unit 201 and the first sub-via hole 3542-1 of the second color sub-pixel of the third repeating unit 203 are away from each other.

For example, as shown in FIGS. 5-6 and FIGS. 9E-10, in each repeating unit 200, the distance between the second sub-via hole 3542-2 and the third via hole 3543 along the first direction is a fifth distance j, and the fifth distance is less than the first distance.

For example, the ratio of the fifth distance to the first distance is in the range from 0.6 to 0.7.

For example, as shown in FIGS. 5-6 and FIGS. 9E-10, the second distance is less than the fifth distance.

For example, as shown in FIGS. 5-6 and FIGS. 9E-10, the distance between the third via hole 3543 in the first repeating unit 201 and the first sub-via hole 3452-1 in the third repeating unit 203 is greater than the second distance. For example, the distance between the first via hole 3541 in the second repeating unit 202 and the first sub-via hole 3542-1 in the third repeating unit 203 is greater than the second distance.

For example, in the same repeating unit 200, the distance between the first via hole 3541 and the second sub-via hole 3452-2 can be 1.15a, and the distance between the second sub-via hole 3452-2 and the third via hole 3543 can be 0.85a. The distance between the third via hole 3543 in the first repeating unit 201 and the first sub-via hole 3452-1 in the third repeating unit 203 can be 1.15a, and the distance between the third via hole 3543 in the first repeating unit 201 and the first via hole 3541 in the second repeating unit 202 can be 0.85a, where a is the width of a sub-pixel.

The above-mentioned distance between the via holes refers to the distance between the geometric centers of the shapes of the via holes along the first direction.

For example, as shown in FIGS. 5-10, the data line Vd and the first power signal line VDD1 are located at a side of the planarization layer 120 away from the second electrode of each sub-pixel, and the orthographic projection of the first center line extending along the second direction in the light emitting region 2100 of each first color sub-pixel 210 on the base substrate 100 is located within the orthographic projection of the data line Vd on the base substrate 100.

In the pixel arrangement structure shown in FIG. 3, there is no source-drain metal layer 2 directly below the center line, extending along the second direction, of the anode of the red sub-pixel 21, and the source-drain metal layer 2 (the first connection portion 28) is provided at only one side of the center line, which leads to the asymmetry of the anode of the red sub-pixel 21 along the first direction. Compared with the positional relationship between the anode of the red sub-pixel and the source-drain metal layer 2 shown in FIG. 3, in the embodiment of the present disclosure, a data line is arranged directly below the center line, extending along the second direction, of the light emitting region of the first color sub-pixel, which can ensure that the second electrode (e.g., the anode) of the first color sub-pixel has certain symmetry along the first direction.

For example, as shown in FIGS. 5-10, the orthographic projection of the third center line extending along the second direction in the light emitting region 2300 of the third color sub-pixel 230 on the base substrate 100 is located within the orthographic projection of the first power signal line VDD1 on the base substrate 100. As shown in FIGS. 6-7, along the second direction, the first power signal line VDD1 is provided directly below the second electrode at the position where the third center line is located. Compared with the positional relationship between the anode, at the position of the center line along the second direction, of the blue sub-pixel 24 and the source-drain metal layer 2 shown in FIG. 3, in the embodiment of the present disclosure, the orthographic projection of the third center line extending along the second direction in the light emitting region of the third color sub-pixel 230 on the base substrate 100 is located within the orthographic projection of the first power signal line VDD1 on the base substrate 100, which can ensure the flatness of the second electrode of the third color sub-pixel 230 in the second direction and alleviate the color cast of the display substrate in the second direction.

For example, as shown in FIGS. 5-10, the orthographic projection of the second electrode 232 included in the third color sub-pixel 230 on the base substrate 100 is overlapped with each of the orthographic projections of the data line Vd, the first connection portion 341 and the second connection portion 342 on the base substrate 100, and the data line Vd is located at one side of the first power signal line VDD1, while the first connection portion 341 and the second connection portion 342 are located at the other side of the first power signal line VDD1. In the embodiment of the present disclosure, two parts, located at both sides of the third center line, of the second electrode of the third color sub-pixel are both overlapped with the source-drain metal layer, which can ensure that the second electrode has certain symmetry along the X direction to alleviate the color cast.

For example, as shown in FIGS. 5-10, the orthographic projection of the second center line extending along the second direction in the light emitting region 2200 of the second color sub-pixel pair 220 on the base substrate 100 is located between the orthographic projection of the first power signal line VDD1 connected thereto on the base substrate 100 and the orthographic projection of the data line Vd connected to first color sub-pixel 210, adjacent to the second color sub-pixel pair 220, on the base substrate 100. For example, the orthographic projection of one of the two second electrodes 222 included in the second color sub-pixel pair 220 on the base substrate 100 is overlapped with the orthographic projection of the data line Vd on the base substrate 100 and the orthographic projection of the second connection portion 342 on the base substrate 100, and the second connection portion 342 and the data line Vd are located at both sides of the second center line; the orthographic projection of the other of the two second electrodes 222 included in the second color sub-pixel pair 220 on the base substrate 100 is overlapped with the orthographic projection of the data line Vd on the base substrate 100 and the orthographic projection of the first connection portion 341 on the base substrate 100, and the first connection portion 341 and the data line Vd are located at both sides of the second center line. In the embodiment of the present disclosure, the source-drain metal layer is not provided directly below the second electrode at the second center line extending along the second direction in the second color sub-pixel pair, and the parts, located at both sides of the second center line, of the second electrode are both overlapped with the source-drain metal layer, which can ensure, as much as possible, that the second electrode has certain symmetry along the X direction to alleviate the color cast.

For example, as shown in FIGS. 5-10, the second electrode 212 of the first color sub-pixel 210 overlaps with the first power signal line VDD1, the data line Vd and the third connection portion 343, and the first power signal line VDD1 and the third connection portion 343 are located at both sides of the data line Vd.

For example, as shown in FIGS. 5-10, in the direction perpendicular to the base substrate 100, one of the two second electrodes 222 included in the second color sub-pixel pair 220 is overlapped with the data line Vd, the first power signal line VDD1, the second connection portion 342 and the third connection portion 343, the second center line of the one of the two second electrodes 222 included in the second color sub-pixel pair 220 is overlapped with the third connection portion 343, the second connection portion 342 and the first power signal line VDD1 are located at one side of the second center line, and the data line Vd is located at the other side of the second center line; in the direction perpendicular to the base substrate 100, the other of the two second electrodes 222 included in the second color sub-pixel pair 220 is overlapped with the data line Vd, the first power signal line VDD1, the first connection portion 341 and the third connection portion 343, the second center line of the other of the two second electrodes 222 included in the second color sub-pixel pair 220 is overlapped with the third connection portion 343, the first connection portion 341 and the first power signal line VDD1 are located at one side of the second center line, and the data line Vd is located at the other side of the second center line.

For example, as shown in FIGS. 5-10, in the direction perpendicular to the base substrate 100, the second electrode 232 of the third color sub-pixel 230 is overlapped with the data line Vd, the first power signal line VdD1, the first connection portion 341, the second connection portion 342 and the third connection portion 343, the data line VD is located at one side of the third center line, and the first connection portion 341, the second connection portion 342 and the third connection portion 343 are located at the other side of the third center line.

Figure 11:
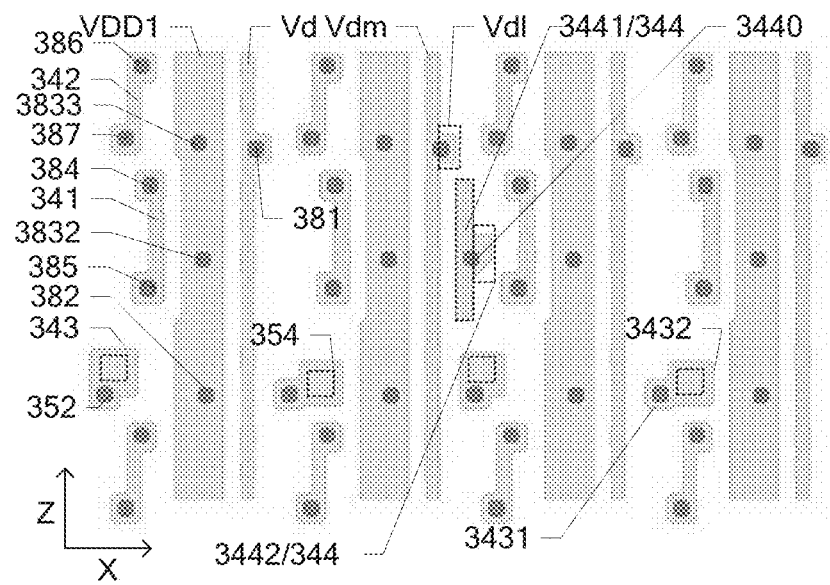
FIG. 11 is a partial planar structural view of a source-drain metal layer in a display substrate provided by another embodiment of the present disclosure.
Figure 12:
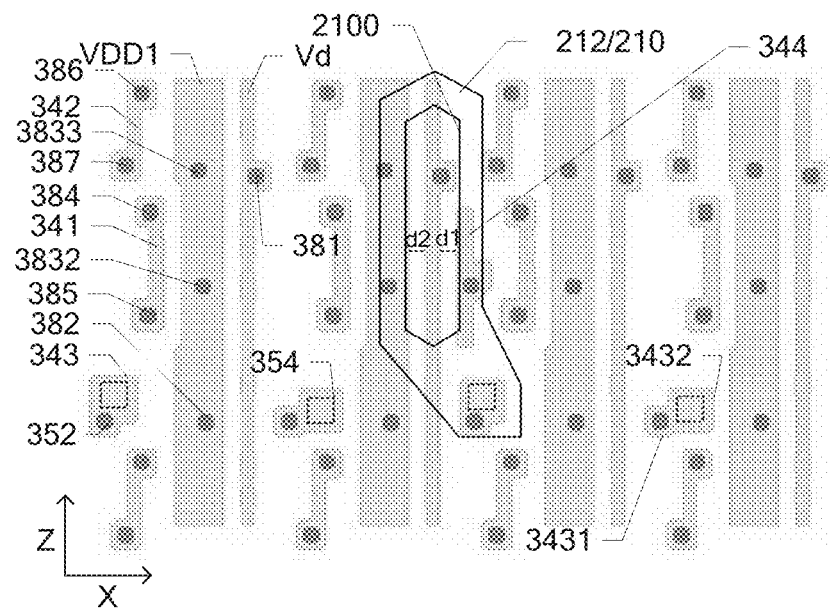
FIG. 12 is a schematic diagram of a relative positional relationship between the source-drain metal layer shown in FIG. 11 and both a second electrode and a light emitting region of a first color sub-pixel.
Figure 13:
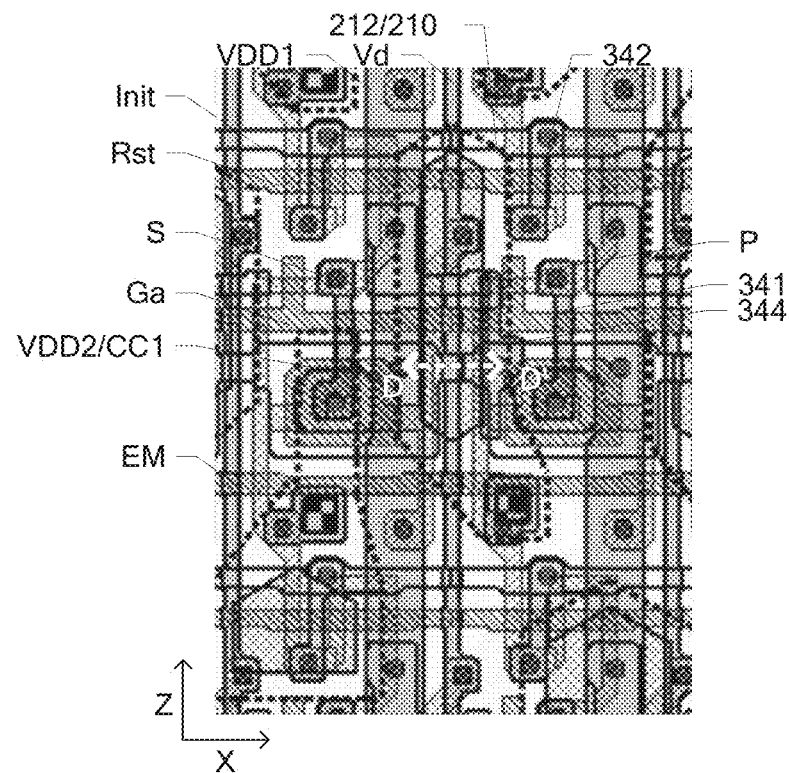
FIG. 13 is a schematic diagram of a laminated structure of various film layers in the display substrate shown in FIG. 11.

FIG. 11 is a partial planar structural view of a source-drain metal layer in a display substrate provided by another embodiment of the present disclosure, FIG. 12 is a schematic diagram of a relative positional relationship between the source-drain metal layer shown in FIG. 11 and both a second electrode and a light emitting region of a first color sub-pixel, and FIG. 13 is a schematic diagram of a laminated structure of various film layers. The embodiment shown in FIGS. 11-13 differs from the embodiment shown in FIG. 10 in that the embodiment shown in FIGS. 11-13 further includes a first pad block 344. As shown in FIGS. 11-13, the display substrate includes a plurality of first pad blocks 344 arranged in the same layer as the data line Vd. For example, the first pad block 344 extends in the second direction. In a third direction perpendicular to the base substrate 100, the second electrode 212 of the first color sub-pixel 210 is overlapped with the data line Vd, the first power signal line VDD1 and the first pad block 344, and for those overlapping parts of the data line Vd, the first power signal line VDD1 and the first pad block 344, the data line Vd with the second electrode 212 of the first color sub-pixel 210, the overlapping part of the data line Vd is located between the overlapping part of the first power signal line VDD1 and the overlapping part of the first pad block 344.

Figure 14:
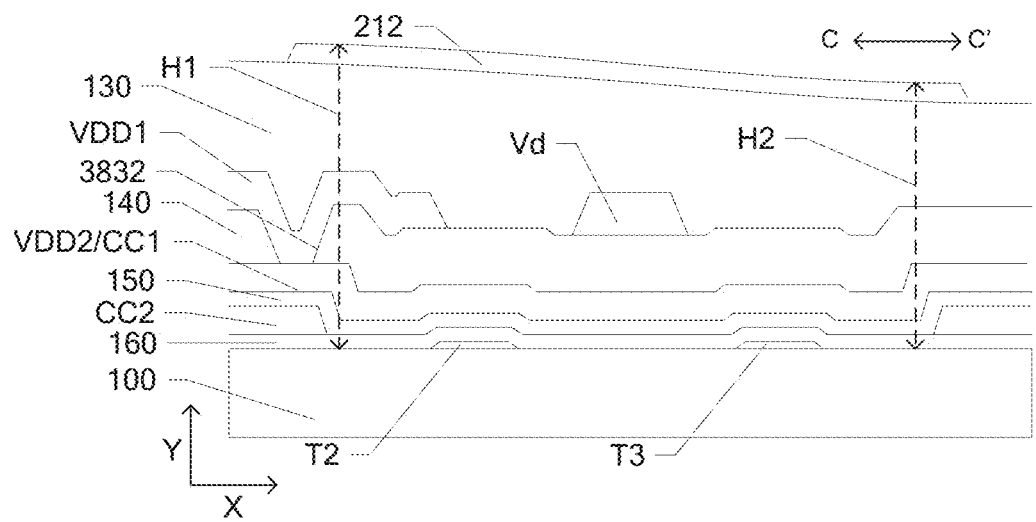
FIG. 14 is a cross-sectional structural view taken along line CC' shown in FIG. 10 and FIG. 6.
Figure 15:
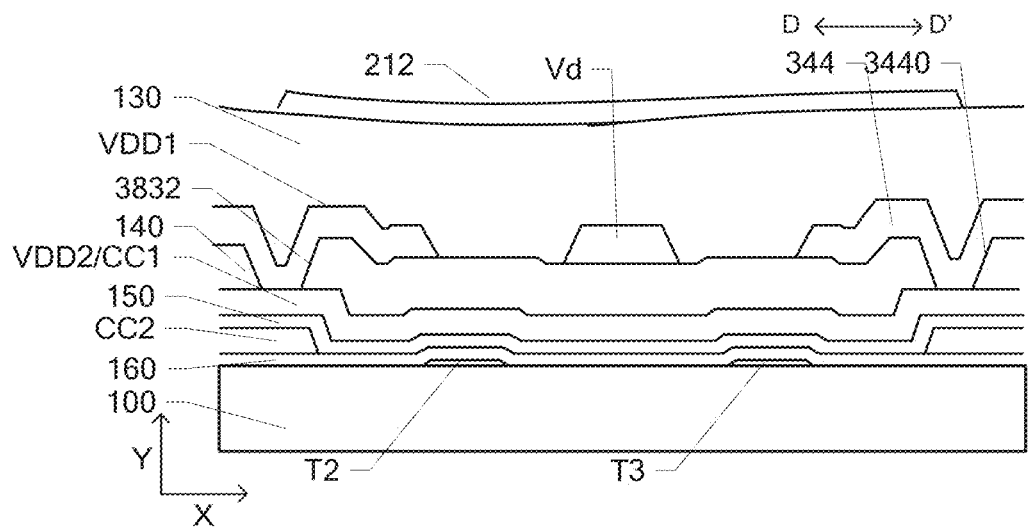
FIG. 15 is a cross-sectional structural view taken along line DD' shown in FIG. 13.

FIG. 14 is a cross-sectional structural view taken along line CC' shown in FIG. 10 and FIG. 6, and FIG. 15 is a cross-sectional structural view taken along line DD' shown in FIG. 13. As shown in FIG. 6, FIG. 10 and FIG. 14, the orthographic projection of the second electrode 212 of the first color sub-pixel 210 on the base substrate 100 is overlapped with the orthographic projection of the data line Vd on the base substrate 100 and the orthographic projection of the first power signal line VDD1 on the base substrate 100. For example, in the third direction perpendicular to the base substrate 100, the center line of the first color sub-pixel 210 extending along the second direction is overlapped with the data line Vd, the first power signal line VDD1 is overlapped with a part of the second electrode 212 located at one side of the center line, and a part of the second electrode 212 located at the other side of the center line is not overlapped with the source-drain metal layer. Therefore, the surfaces, away from the base substrate 100, of the parts, located at both sides of the center line, of the second electrode 212, have different distances to the base substrate 100, and there is a height difference. That is, the distance from the surface, away from the base substrate, of the second electrode 212 located on the first power signal line VDD1 to the base substrate 100 is H1, and the distance from the surface, away from the base substrate, of the second electrode 212 not located on the first power signal line VDD1 and the data line VD to the base substrate 100 is H2; H1>H2, and there is a height difference. In addition, because the structure between the first power signal line VDD1 and the base substrate 100 is different from the structure between the data line Vd and the base substrate 100, the distance from the surface, away from the base substrate 100, of the first power signal line VDD1 to the base substrate 100 is greater than the distance from the surface, away from the base substrate 100, of the data line Vd to the base substrate 100. Therefore, in the first direction, the second electrode 212 will be inclined as shown in FIG. 14, which will easily lead to the occurrence of color cast when the first color sub-pixel displays.

As shown in FIG. 13 and FIG. 15, a first pad block 344 is provided at a side of the data line Vd away from the first power signal line VDD1, and in the third direction perpendicular to the base substrate 100, the first pad block 344 is overlapped with the second electrode 212 of the first color sub-pixel, so that the height difference between the second electrode 212 located at both sides of the data line Vd and the base substrate 100 can be reduced as much as possible, thereby avoiding the occurrence of color cast when the first color sub-pixel displays.

For example, in the third direction, the size of the data line Vd is approximately the same as the size of the first pad block 344, that is, the thickness of the data line Vd is approximately the same as the thickness of the first pad block 344.

For example, as shown in FIGS. 11-13, in the third direction, the center line, extending along the second direction, of the second electrode 212 of the first color sub-pixel 210 is overlapped with the data line Vd, and two parts of the second electrode 212 located at both sides of the center line are overlapped with the first power signal line VDD1 and the first pad block 344, respectively. In the embodiment of the present disclosure, the center line extending along the second direction in the light emitting region of the first color sub-pixel is arranged to be overlapped with the data line, which can further ensure that the second electrode has certain symmetry along the first direction, so as to further reduce the probability of the occurrence of color cast.

For example, the orthographic projection of the center line of the first color sub-pixel on the base substrate 100 is located within the orthographic projection of the data line Vd on the base substrate 100.

For example, as shown in FIGS. 11-13, for the overlapping portions of the data line Vd, the first power signal line VDD1 and the first pad block 344 with the second electrode 212, the distance between the edges of the overlapping part of the first pad block 344 and the overlapping part of the data line Vd close to each other is d1, the distance between the edges of the overlapping part of the first power signal line VDD1 and the overlapping part of the data line Vd close to each other is d2, and the ratio between the distance d1 and the distance d2 is approximately in the range from 0.9 to 1.1.

For example, the distance d1 and the distance d2 are approximately equal.

The embodiment of the present disclosure, by setting the distance between the first pad block and the data line approximately equal to the distance between the first power signal line and the data line, it can further ensure that the height difference, between the two parts of the second electrode, which are symmetrical relative to the center line of the second electrode, and the base substrate, is as small as possible, so that the second electrode has better symmetry along the first direction, thereby reducing the probability of the occurrence of color cast.

For example, as shown in FIGS. 11-13, in the third direction, the part of the second electrode 212 overlapped with the first power signal line VDD1 is a first overlapping part, the part of the second electrode 212 overlapped with the first pad block 344 is a second overlapping part, and the size of the first overlapping part along the second direction is greater than the size of the second overlapping part along the second direction. For example, the area of the first overlapping part is greater than the area of the second overlapping part. For example, the size of the first overlapping part along the first direction can be approximately equal to the size of the second overlapping portion along the first direction. For example, the ratio of the size of the first overlapping part along the first direction to the size of the second overlapping part along the first direction can be approximately in the range from 0.8 to 1.2. The size of the first overlapping part and the size of the second overlapping part can be adjusted according to the margin of design space. In addition to enlarging the second overlapping part, the size of the first overlapping part can be reduced, and for example, in the first direction, the width of the first power signal line VDD1 can be reduced, so as to reduce the size of the part of the second electrode 212 overlapped with the first power signal line VDD1.

Referring to FIGS. 9D and 10, the data line Vd overlapped with the second electrode 212 of the first color sub-pixel 210 is a data line Vd connected with the second electrode of the data writing transistor T2 in the second color sub-pixel 220 adjacent to the first color sub-pixel 210, and the data line Vd is electrically connected with the second electrode of the data writing transistor T2 through a via hole 381 (second connection hole) penetrating through the gate insulating layer 160, the first insulating layer 150 and the second insulating layer 140. As shown in FIGS. 11-13, the data line Vd includes a data line main body portion Vdm extending along the first direction and a data line connection portion Vdl connected with the data line main body portion Vdm, and the data line connection portion Vdl is located at a side of the data line main body portion Vdm close to the first pad block 344. A part of the data line connection portion Vdl close to the data line main body portion Vdm is electrically connected with the second electrode of the data writing transistor of the second color sub-pixel through the via hole 381. In addition, the first pad block 344 and the third connection portion 343 connected with the second electrode 212 of the first color sub-pixel 210 are located at the same side of the data line Vd, and a straight line extending along the second direction passes through the first pad block 344 and the third connection portion 343. Therefore, the end of the first pad block 344 close to the third connection portion 343 cannot be connected with the third connection portion 343, the end of the first pad block 344 away from the third connection portion 343 cannot be connected with the data line connection portion Vdl, and the size of the first pad block 344 along the second direction cannot be designed to be large. For example, the length of the first pad block 344 in the second direction can be in the range from 20 to 30 microns. For example, the distance between the edge of the first pad block 344 and the edge of the data line main body portion Vdm close to each other, the distance between the edge of the first pad block 344 and the edge of the data line connection portion Vdl close to each other and the distance between the edge of the first pad block 344 and the edge of the third connection portion 343 close to each other, are greater than 3 microns.

For example, the maximum size of the second electrode 212 of the first color sub-pixel 210 along the second direction is greater than the maximum size of the second electrode 212 of the first color sub-pixel 210 along the first direction. The maximum size of the second electrode 212 along the second direction refers to the maximum size of the entire second electrode 212 including the main body electrode and the connection electrode along the second direction.

For example, the maximum size of the first pad block 344 along the second direction is greater than the maximum size of the first pad block 344 along the first direction. For example, the size of the first pad block 344 along the first direction can be in the range from 2.5 to 3 microns.

For example, as shown in FIG. 12, the distance between the boundaries of the data line connection portion Vdl and the third connection portion 343 along the second direction is greater than the size of the first pad block 344 along the second direction.

For example, as shown in FIGS. 11-13, the first pad block 344 is overlapped with the scan signal line Ga. That is, the end of the first pad block 344 away from the third connection portion 343 is located at a side of the scan signal line Ga away from the third connection portion 343. For example, the end of the first pad block 344 away from the third connection portion 343 is overlapped with the light shielding portion S. For example, the first pad block 344 is overlapped with the channel region between the double gate electrodes of the threshold compensation transistor, that is, overlapped with the active semiconductor layer between the two gate electrodes of the threshold compensation transistor T3, so as to prevent the active semiconductor layer between the two gate electrodes from being illuminated to change its characteristics, for example, to prevent the voltage of this part of the active semiconductor layer from changing to avoid crosstalk. For example, the first pad block 344 is not overlapped with the protruding structure P protruding from the scan signal line Ga, so as to prevent the signal on the protruding structure P from being affected.

For example, as shown in FIGS. 11-13, the first pad block 344 is overlapped with the first electrode CC1 of the storage capacitor C. For example, the edge of the first electrode CC1 of the storage capacitor C close to the third connection portion 343 is located at a side, away from the scan signal line Ga, of the end of the first pad block 344 close to the third connection portion 343.

For example, as shown in FIGS. 11-13, the first pad block 344 is not overlapped with the reset control signal line Rst.

For example, as shown in FIGS. 11-13, the first pad block 344 includes a strip-shaped main body 3441 and a protruding portion 3442 connected with each other, the protruding portion 3442 is located at a side of the strip-shaped main body 3441 away from the data line Vd, and the part of the protruding portion 3442 close to the strip-shaped main body

3441 is electrically connected with the first electrode CC1 of the storage capacitor C through a via hole 3440 (first connection hole) penetrating through the second insulating layer located between the first electrode CC1 of the storage capacitor C and the first power signal line VDD1. In the embodiment of the present disclosure, the first pad block is electrically connected with the first power signal line through the first electrode of the storage capacitor, which can provide a constant electrical signal for the first pad block to prevent the first pad block from being in a floating state and affecting the normal operation of the pixel circuit, and can also better reduce the coupling effect between the threshold compensation transistor and other conductive patterns nearby, so that the working performance of the display substrate is more stable.

For example, the via hole 3440 is located in the part of the first pad block 344 where the strip-shaped main body 3441 and the protruding portion 3442 are connected. The existence of the protruding portion 3442 is equivalent to widening the first pad block 344 along the first direction, so that the via hole 3440 has a larger design and process margin and is more reliable during manufacturing.

For example, as shown in FIGS. 11-13, a part of the strip-shaped main body 3441 is electrically connected with the first electrode CC1 of the storage capacitor C through the via hole 3440. For example, the protruding portion 3442 of the first pad block 344 is not overlapped with the opening of the first electrode CC1 of the storage capacitor C.

For example, the orthographic projection of the via hole 3440 on the base substrate 100 is located within the orthographic projection of the second electrode 212 of the first color sub-pixel 210 on the base substrate 100 and located at the outer side of the orthographic projection of the light emitting region 2100 of the first color sub-pixel 210 on the base substrate 100, so as to prevent the display of the second color sub-pixel from being affected.

For example, as shown in FIGS. 11-13, the second electrode 212 of the first color sub-pixel 210 also covers a via hole 3832 connecting the first power signal line VDD1 with the first electrode CC1 (second power signal line VDD2) of the storage capacitor C, and the via hole 3832 and the via hole 3440 are located on a straight line extending along the first direction. For example, the distance between the geometric center of the via hole 3832 and the data line Vd is approximately equal to the distance between the geometric center of the via hole 3440 and the data line Vd, or the ratio of the distance between the geometric center of the via hole 3832 and the data line Vd to the distance between the geometric center of the via hole 3440 and the data line Vd is in the range from 0.8 to 1.2, thus ensuring that the second electrode 212 has certain symmetry along the first direction.

For example, one edge of the light emitting region 2100 of the first color sub-pixel 210 along the second direction is overlapped with the first power signal line VDD1, and the other edge of the light emitting region 2100 of the first color sub-pixel 210 along the second direction is overlapped with the first pad block 344, so as to ensure that the light emitting region 2100 has certain symmetry along the first direction.

Figure 16:
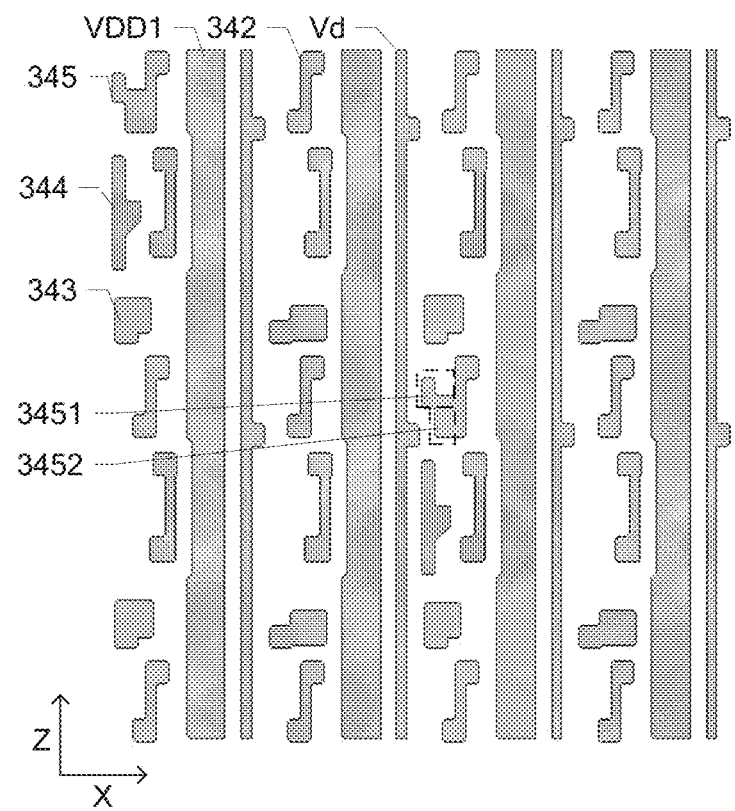
FIG. 16 is a partial planar structural view of a source-drain metal layer of a display substrate provided by another embodiment of the present disclosure.
Figure 17:
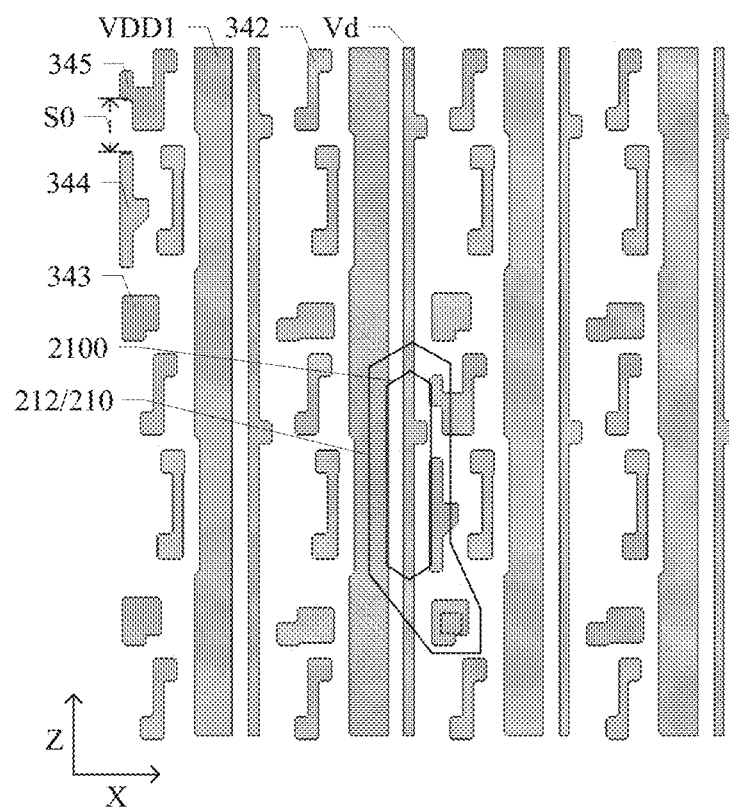
FIG. 17 is a schematic diagram of a laminated structure formed of the source-drain metal layer shown in FIG. 16 and a second electrode of a first color sub-pixel.
Figure 18:
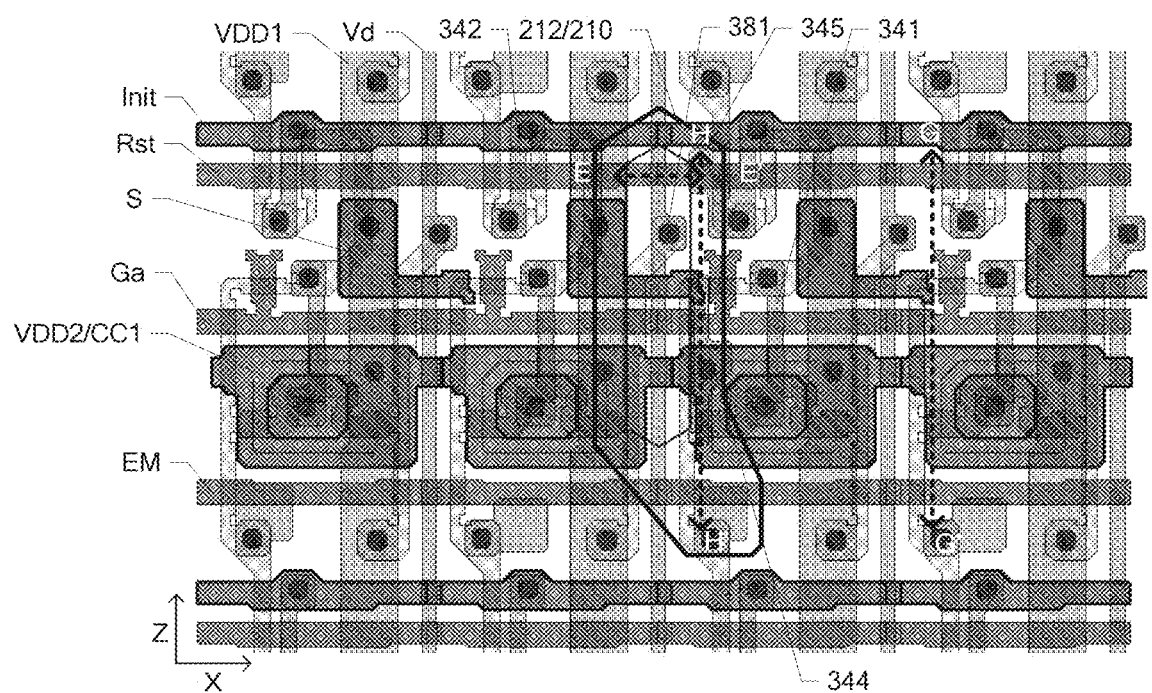
FIG. 18 is a schematic diagram of a laminated structure of various film layers of the display substrate shown in FIG. 16.

FIG. 16 is a partial planar structural view of a source-drain metal layer of a display substrate provided by another embodiment of the present disclosure, FIG. 17 is a schematic diagram of a positional relationship between the source-drain metal layer shown in FIG. 16 and both a second electrode and a light emitting region of a first color sub-pixel, and FIG. 18 is a schematic diagram of a laminated structure of various film layers. The embodiment shown in FIGS. 16-18 differs from the embodiment shown in FIGS. 11-13 in that the embodiment shown in FIGS. 16-18 further includes a second pad block 345. As shown in FIGS. 16-18, the display substrate further includes a plurality of second pad blocks 345 arranged in the same layer as the plurality of first pad blocks 344. In the third direction perpendicular to the base substrate, two parts of the second electrode 212 of the first color sub-pixel 210 located at both sides of the center line are overlapped with the first power signal line VDD1 and the second pad block 345, respectively. For these overlapping parts of the data line Vd, the first power signal line VDD1 and the second pad block 345 with the second electrode 212, the distance between the edges of the overlapping part of the second pad block 345 and the overlapping part of the data line Vd close to each other is approximately equal to the distance between the edges of the overlapping part of the first power signal line VDD1 and the overlapping part of the data line Vd close to each other. In the embodiment of the present disclosure, while the first pad block is arranged, the second pad block is also arranged, which can better avoid the occurrence of color cast when the first color sub-pixel displays.

Figure 19:
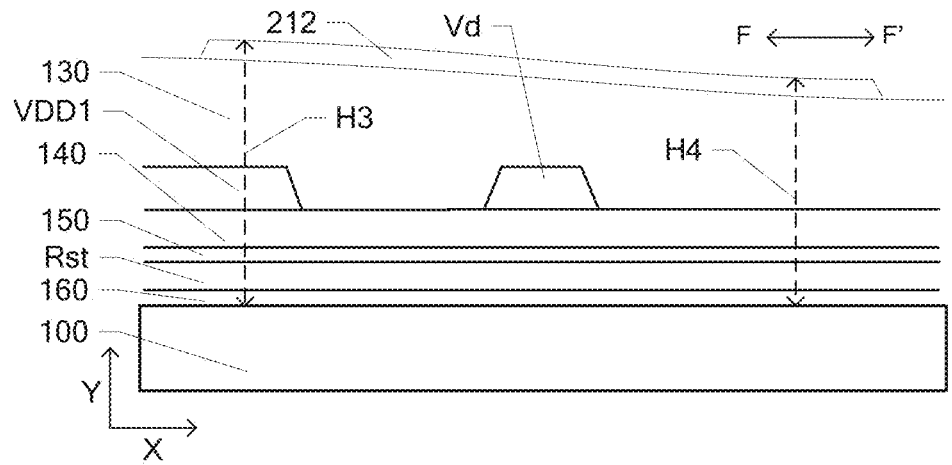
FIG. 19 is a cross-sectional structural view taken along line FF' shown in FIG. 10 and FIG. 6.
Figure 20:
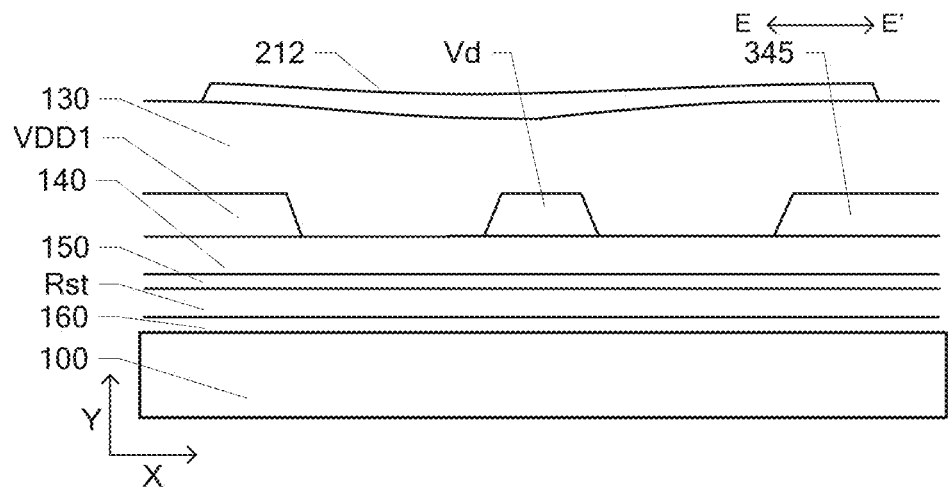
FIG. 20 is a cross-sectional structural view taken along line EE' shown in FIG. 18.

FIG. 19 is a cross-sectional structural view taken along line FF' shown in FIG. 10 and FIG. 6, and FIG. 20 is a cross-sectional structural view taken along line EE' shown in FIG. 18. As shown in FIG. 6, FIG. 10 and FIG. 19, the orthographic projection of the second electrode 212 of the first color sub-pixel 210 on the base substrate 100 is overlapped with the orthographic projection of the data line Vd on the base substrate 100 and the orthographic projection of the first power signal line VDD1 on the base substrate 100. For example, in the third direction perpendicular to the base substrate 100, the center line of the light emitting region of the first color sub-pixel 210 extending along the second direction is overlapped with the data line Vd, the first power signal line VDD1 is overlapped with a part of the second electrode 212 located at one side of the center line, and a part of the second electrode 212 located at the other side of the center line is not overlapped with the source-drain metal layer. Therefore, the surfaces, away from the base substrate 100, of the parts, located at both sides of the center line, of the second electrode 212, have different distances to the base substrate 100, and there is a height difference. That is, the distance from the surface, away from the base substrate, of the second electrode 212 located on the first power signal line VDD1 to the base substrate 100 is H3, and the distance from the surface, away from the base substrate, of the second electrode 212 not located on the first power signal line VDD1 and the data line VD to the base substrate 100 is H4; H3>H4, and there is a height difference. Therefore, in the first direction, the second electrode 212 will be inclined as shown in FIG. 19, which will easily lead to the occurrence of color cast when the first color sub-pixel displays.

As shown in FIG. 16 and FIG. 20, a second pad block 345 is provided at a side of the data line Vd away from the first power signal line VDD1, and in the third direction perpendicular to the base substrate 100, the second pad block 345 is overlapped with the second electrode 212 of the first color sub-pixel, so that the height difference between the second electrode 212 located at both sides of the data line Vd and the base substrate 100 can be reduced as much as possible, thereby avoiding the occurrence of color cast when the first color sub-pixel displays.

For example, in the third direction, the size of the data line Vd is approximately the same as the size of the second pad block 345, that is, the thickness of the data line Vd is approximately the same as the thickness of the second pad block 345.

For example, as shown in FIGS. 16-18, the straight line extending along the second direction passes through the first pad block 344 and the second pad block 345, which can further increase the symmetry of the second electrode of the first color sub-pixel along the first direction. The embodiment of the present disclosure is not limited thereto, and may only include the second pad block instead of the first pad block, as long as it can be ensured that the second electrode of the first color sub-pixel has good symmetry along the first direction.

Figure 21:
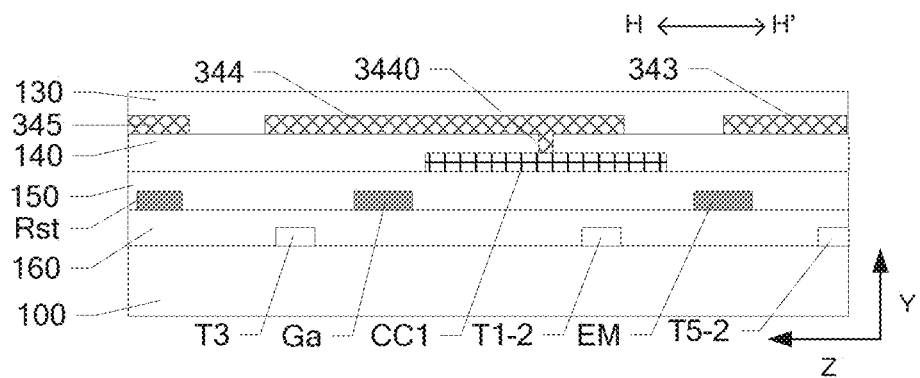
FIG. 21 is a partial cross-sectional structural view taken along line HH' shown in FIG. 18.
Figure 22:
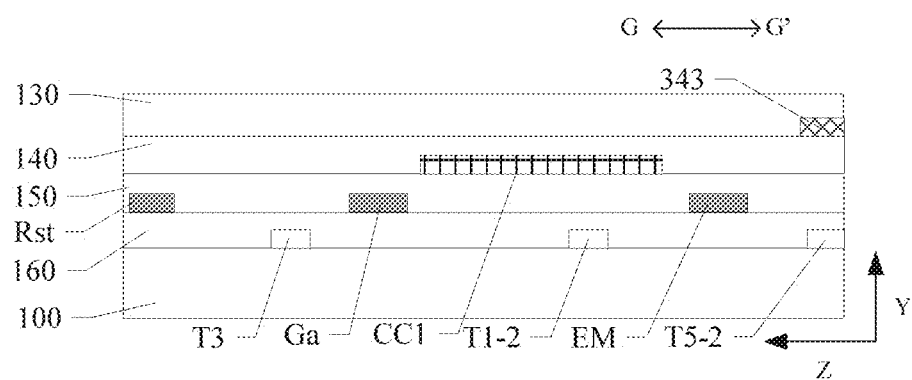
FIG. 22 is a partial cross-sectional structural view taken along line GG' shown in FIG. 18.

For example, FIG. 21 is a partial cross-sectional structural view taken along line HH' shown in FIG. 18, and FIG. 22 is a partial cross-sectional structural view taken along line GG' shown in FIG. 18. FIGS. 21-22 merely illustrate the multilayer structure at a side of the second electrode facing the base substrate, and the cross-sectional view shown in FIG. 21 is a partial cross-sectional view of the pixel circuit in the case where the first color sub-pixel 210 includes the first pad block 344 and the second pad block 345, and the cross-sectional view shown in FIG. 22 is a partial cross-sectional view of the pixel circuit in the second color sub-pixel. In some embodiments, the cross-sectional view taken along the same position of the pixel circuit in the third color sub-pixel is the same as the cross-sectional view shown in FIG. 22.

For example, as shown in FIG. 18, FIG. 21 and FIG. 22, the pattern of the source-drain metal layer of the pixel circuit of the first color sub-pixel is different from the pattern of the source-drain metal layer of the pixel circuit of the second color sub-pixel and the pattern of the source-drain metal layer of the pixel circuit of the third color sub-pixel. The pattern of the source-drain metal layer of the second color sub-pixel is the same as the pattern of the source-drain metal layer of the third color sub-pixel, and in contrast to the pattern of the source-drain metal layer of the second color sub-pixel, the pattern of the source-drain metal layer of the first color sub-pixel further includes the first pad block 344 and the second pad block 345.

For example, the same repeating unit includes four pixel circuits arranged along the X direction; among the four pixel circuits, only one pixel circuit includes the first pad block and the second pad block; and repeating units, each of which includes the four pixel circuits, are arranged along the X direction. That is, among every four pixel circuits arranged along the first direction, there is one pixel circuit which includes the first pad block and the second pad block, and the every four pixel circuits are repeatedly arranged.

For example, as shown in FIGS. 16-18, for the overlapping parts of the data line Vd, the first pad block 344 and the second pad block 345 with the second electrode 212 of the first color sub-pixel 210, the edge of the overlapping part of the first pad block 344 close to the overlapping part of the data line Vd and at least part of the overlapping part of the edge of the second pad block 345 close to the overlapping part of the data line Vd are basically on the same straight line. For example, the ratio of the distance between the edges of the second pad block 345 and the data line Vd close to each other to the distance between the edges of the first power signal line VDD1 and the data line Vd close to each other is in the range from 0.9 to 1.1. That is, the distance between the edges of the second pad block 345 and the data line Vd close to each other is approximately equal to the distance between the edges of the first power signal line VDD1 and the data line Vd close to each other, which can further ensure that the height difference, between the two parts of the second electrode, which are symmetrical relative to the center line of the second electrode, and the base substrate, is as small as possible, so that the second electrode has better symmetry along the first direction, thereby reducing the probability of the occurrence of color cast.

For example, as shown in FIG. 16-FIG. 18, there is a spacing S0 between the edge of the first pad block 344 and the edge of the second pad block 345 which are approximately on the same straight line, and along the second direction, the size of the spacing S0 is not greater than half of the size of the light emitting region 2100 of the second color sub-pixel 210, so as to ensure, as much as possible, that the second electrode has better symmetry along the first direction.

For example, as shown in FIGS. 16-18, one edge of the light emitting region 2100 of the first color sub-pixel 210 along the second direction is overlapped with the first power signal line VDD1, and the other edge of the light emitting region 2100 of the first color sub-pixel 210 along the second direction is overlapped with the second pad block 345, so as to ensure that the light emitting region 2100 has better symmetry along the first direction.

For example, in terms of the first pad block 344 and the second pad block 345 overlapped with the second electrode 212 of each first color sub-pixel 210, the first pad block 344 and the second pad block 345 are arranged along the second direction.

For example, in the second direction, the center of the first pad block 344 and the center of the second pad block 345 are located at both sides of the light emitting region of the first color sub-pixel 210. Here, the centers of the first pad block and the second pad block refer to the geometric centers of their planar shapes.

For example, the maximum size of the second pad block 345 along the second direction is greater than the maximum size of the second pad block 345 along the first direction.

For example, as shown in FIGS. 16-18, the orthographic projection of the via hole 381 (second connection hole) on a straight line extending along the second direction is located within the orthographic projection of the spacing S0 on the straight line. That is, there is a spacing between the first part 3451 (to be mentioned later) of the second pad block 345 and the strip-shaped main body 3441 of the first pad block 344, and the orthographic projection of the data line connection portion Vdl on the straight line extending along the second direction is located within the orthographic projection of the spacing S0 on the straight line, so that neither the first pad block 344 nor the second pad block 345 is in contact with the data line connection portion Vdl of the data line VD, which can prevent the first pad block 344 and the second pad block 345 from affecting the signal on the data line.

For example, the distance between the second pad block 345 and the data line connection portion Vdl is greater than 2.5 microns, and the distance between the second pad block 345 and the data line main body portion Vdm is greater than 2.5 microns.

For example, as shown in FIG. 18, the second pad block 345 is not overlapped with the reset power signal line Init to prevent a capacitor from being formed between the second pad block 345 and the reset power signal line Init.

For example, as shown in FIG. 18, the second pad block 345 is electrically connected with the reset power signal line Init, and the reset power signal line Init can provide a constant electrical signal for the second pad block 345, so as to prevent the second pad block 345 from being in a floating state and affecting the normal operation of the pixel circuit.

For example, as shown in FIG. 18, the second pad block 345 is located in the same layer as the second connection portion 342, and the second pad block 345 can be electrically connected with the reset power signal line Init through the second connection portion 342.

For example, as shown in FIG. 18, the second pad block 345 can be integrally formed with the second connection portion 342 to save the manufacturing process.

For example, as shown in FIGS. 16-18, the second pad block 345 includes a second part 3452 close to the first pad block 344 and a first part 3451 away from the first pad block 344. A straight line extending along the second direction passes through the first part 3451 of the second pad block 345 and the first pad block 344. For example, the edge of the first part 3451 of the second pad block 345 close to the data line Vd and the edge of the first pad block 344 close to the data line Vd are basically on the same straight line, that is, the distance between the edges, close to each other, of the first part 3451 in the second pad block 345 and of the data line Vd is approximately equal to the distance between the edges, close to each other, of the first pad block 344 and of the data line Vd. For example, the edge of the second part 3452 of the second pad block 345 close to the data line Vd is located at a side, away from the data line Vd, of the edge of the first part 3451 of the second pad block 345 close to the data line Vd, that is, the first part 3451 of the second pad block 345 is closer to the data line main body portion Vdm than the second part 3452 of the second pad block 345. For example, the distance between the edges, close to each other, of the first part 3451 in the second pad block 345 and of the data line main body portion VdM in the data line Vd is approximately equal to the distance between the edges, close to each other, of the second part 3452 in the second pad block 345 and of the data line connection portion Vdl in the data line Vd, or the distance ratio therebetween is in the range from 0.8 to 1.2.

For example, the orthographic projection of the data line connection portion Vdl on a straight line extending along the second direction is not overlapped with the orthographic projections of the first pad block 344 and of the first part 3451 of the second pad block 345 on the straight line, but is overlapped with the orthographic projection of the second part 3452 of the second pad block 345 on the straight line.

For example, as shown in FIG. 18, the second part 3452 of the second pad block 345, the via hole 381 used for connecting the data line Vd with the data writing transistor T2, the via hole 3833 used for connecting the first power signal line VDD1 and the light shielding portion, and the via hole 387 used for connecting the second reset transistor T7 with the reset power signal line Init are located basically on a straight line extending along the X direction.

For example, in the first direction, the maximum size of the first part 3451 of the second pad block 345 is greater than the maximum size of the second part 3452 of the second pad block 345.

Figure 23:
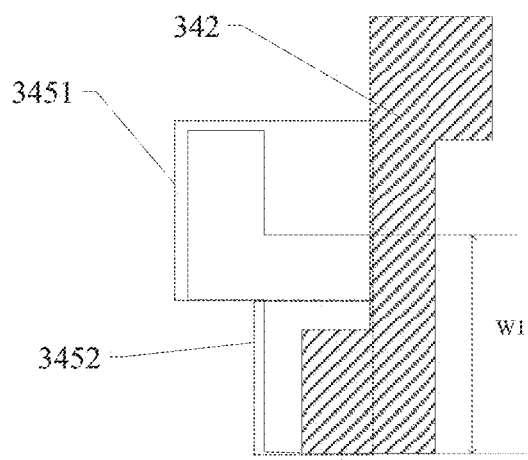
FIG. 23 is an enlarged view of a second pad block in the display substrate shown in FIG. 16.

For example, FIG. 23 is an enlarged view of a second pad block in the display substrate shown in FIG. 16. In FIG. 23, the white filled part is the second pad block, and the diagonal filled part is the second connection portion. As shown in FIG. 23, the shape of the first part 3451 of the second pad block 345 can be a normal L-shape, and the shape of the second part 3452 of the second pad block 345 can be an inverted L-shape, so as to facilitate the integrated manufacturing of the second pad block 345 and the second connection portion 342.

Compared with the shape of the second connection portion included in the second color sub-pixel or the third color sub-pixel, the shape of the second pad block in the present embodiment is the shape formed by excluding the shape of a part of the second connection portion from the whole shape of the second pad block and the second connection portion.

For example, as shown in FIG. 18, the second pad block 345 is overlapped with the reset control signal line Rst.

For example, in the normal L-shaped structure of the first part 3451 of the second pad block 345, a portion extending along the second direction is overlapped with the reset control signal line Rst. In order to avoid that the second pad block 345 has a large overlapping area with the reset control signal line Rst to generate a large parasitic capacitance, the size of the overlapping part in the X direction should be designed to be small. However, in order to ensure that the second pad block contributes to the flatness and symmetry of the second electrode of the first color sub-pixel, the width of the overlapping part between the portion of the normal L-shaped structure extending along the second direction and the reset control signal line Rst is not intended to be too small. Considering comprehensively, the width of the overlapping part between the portion of the normal L-shaped structure extending along the second direction and the reset control signal line Rst can be in the range from 2.5 to 3 microns. That is, the second pad block is not provided in the empty region between the portion of the normal L-shaped structure extending along the second direction and the second connection portion 342, thus reducing the parasitic capacitance generated by the second pad block and the reset control signal line Rst.

For example, the width, along the first direction, of the portion extending along the second direction in the normal L-shaped structure of the first part 3451 of the second pad block 345, is approximately the same as the width, along the first direction, of the strip-shaped main body 3441 of the first pad block 344, for example, in the range from 2.5 to 3 microns.

For example, the size of the second part 3452 of the second pad block 345 and part of the second connection portion 342 connected with the second part 3452 along the first direction is approximately 6 microns, and the size, along the second direction, of the part extending along the second direction in the L-shaped structure of the first part 3451 of the second pad block 345 can be 6 microns.

For example, the distance W1 between the edge, away from the second part 3452 of the second pad block 345, of the part extending along the first direction in the normal L-shaped structure of the first part 3451 of the second pad block 345, and the edge, close to the first pad block 344, of the second part 3452 of the second pad block 345, can be 8 microns.

Another embodiment of the present disclosure provides a display device, which includes any one of the above display substrates.

In the display device provided by the embodiment of the present disclosure, by setting the distances between the center lines of the sub-pixels extending along the second direction, the occurrence of the color cast phenomenon can be avoided as much as possible, while it is ensured that the position of the via hole in the planarization layer is not greatly adjusted to reduce the influence on the overall pixel circuit structure.

In the display device provided by the embodiment of the present disclosure, the center line extending along the second direction in the light emitting region of the first color sub-pixel is arranged to be overlapped with the data line, which can further ensure that the second electrode of the first color sub-pixel has certain symmetry along the first direction, so as to further reduce the probability of the occurrence of color cast.

In the display device provided by the embodiment of the present disclosure, the second electrode of the first color sub-pixel is overlapped with the data line, the first power signal line and the first pad block, and for the overlapping parts of the data line, the first power signal line and the first pad block with the second electrode, the overlapping part of the data line is located between the overlapping part of the first power signal line and the overlapping part of the first pad block, which can further ensure that the height difference, between the two parts, that are symmetrical relative to the center line of the second electrode of the first color sub-pixel, of the second electrode of the first color sub-pixel, and the base substrate, is as small as possible, so that the second electrode has better symmetry along the first direction, thereby reducing the probability of the occurrence of color cast.

In the display device provided by the embodiment of the present disclosure, while the first pad block is arranged, the second pad block is also arranged, and the second pad block is arranged in the same layer as the first pad block, and the second pad block and the first pad block are located at the same side of the data line and are overlapped with the second electrode of the first color sub-pixel, which can further ensure that the height difference, between the two parts of the second electrode of the first color sub-pixel, that are symmetrical relative to the center line of the second electrode of the first color sub-pixel, and the base substrate, is as small as possible, and improve the symmetry of the second electrode of the first color sub-pixel along the first direction, so as to better avoid the occurrence of color cast when the first color sub-pixel displays.

For example, the display device provided by at least one embodiment of the present disclosure can be any product or component with display function, such as a mobile phone, a tablet computer, a television, a display, a notebook computer, a digital photo frame, a navigator, etc.

The Following Statements should be Noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, and the protection scope of the present disclosure is not limited thereto. Therefore, the protection scope of the present disclosure should be determined based on the protection scope of the claims.

What is claimed is:

1. A display substrate, comprising:
a base substrate;
a plurality of repeating units on the base substrate, each of the plurality of repeating units comprising one first color sub-pixel, one second color sub-pixel pair and one third color sub-pixel which are sequentially arranged along a first direction, the second color sub-pixel pair comprising two second color sub-pixels which are arranged along a second direction, the plurality of repeating units being arranged along the first direction to form a plurality of repeating unit groups, the plurality of repeating unit groups being arranged along the second direction, and adjacent repeating unit groups among the plurality of repeating unit groups being shifted from each other along the first direction;
wherein, in each of the plurality of repeating units, a distance, along the first direction, between a center of the third color sub-pixel and a center of the second color sub-pixel pair is a first distance;
two adjacent repeating units located in a same repeating unit group comprise a first repeating unit and a second repeating unit, the third color sub-pixel of the first repeating unit is adjacent to the first color sub-pixel of the second repeating unit, a repeating unit adjacent to both the first repeating unit and the second repeating unit and located in an adjacent repeating unit group is a third repeating unit, a distance, along the first direction, between a center of the third color sub-pixel in the first repeating unit and a center of the second color sub-pixel pair in the third repeating unit is a second distance, and the first distance is different from the second distance.

2. The display substrate according to claim 1, wherein the first distance is greater than the second distance.

3. The display substrate according to claim 1, wherein a ratio of the first distance to the second distance is in a range from 1.5 to 2.3.

4. The display substrate according to claim 1, wherein a distance, along the first direction, between a center of the first color sub-pixel in the second repeating unit and the center of the second color sub-pixel pair in the third repeating unit is a third distance, and the third distance is approximately equal to the second distance.

5. The display substrate according to claim 1, wherein, in each of the plurality of repeating units, a distance, along the first direction, between a center of the first color sub-pixel and the center of the second color sub-pixel pair is a fourth distance, and the fourth distance is approximately equal to the first distance.

6. The display substrate according to claim 1, wherein each sub-pixel comprises a light emitting region, and the light emitting region of the first color sub-pixel and the light emitting region of the third color sub-pixel have a shape of a hexagon or an ellipse, and the light emitting region of each second color sub-pixel in the second color sub-pixel pair has a shape of a pentagon, a circle or a droplet-shape;

each sub-pixel comprises an organic light emitting element and a pixel circuit for driving the organic light emitting element, the organic light emitting element comprises a first electrode, a light emitting layer and a second electrode which are stacked in sequence, the first electrode of the organic light emitting element is located at a side of the second electrode of the organic light emitting element away from the base substrate, the pixel circuit comprises a light emitting control transistor, and a planarization layer is disposed between the second electrode of the organic light emitting element and the light emitting control transistor;

in the first color sub-pixel, the second electrode of the organic light emitting element is connected with the light emitting control transistor through a first via hole located in the planarization layer; in the second color sub-pixel pair, two second electrodes of two organic light emitting elements of the two second color sub-pixels are respectively connected with two light emitting control transistors through two second via holes located in the planarization layer; in the third color sub-pixel, the second electrode of the organic light emitting element is connected with the light emitting control transistor through a third via hole located in the planarization layer.

7. The display substrate according to claim 6, wherein, in each of the plurality of repeating units, the two second via holes include a first sub-via hole and a second sub-via hole, and the first via hole, the second sub-via hole and the third via hole are approximately located on a straight line extending along the first direction.

8. The display substrate according to claim 7, wherein, in the second color sub-pixel pair, two light emitting regions included in the two second color sub-pixels are located between the first sub-via hole and the second sub-via hole in the second direction.

9. The display substrate according to claim 7, wherein the first via hole, the second sub-via hole and the third via hole in the first repeating unit, and the first sub-via hole in the third repeating unit are approximately located on a straight line extending along the first direction.

10. The display substrate according to claim 8, wherein, in each of the plurality of repeating units, a distance between the second sub-via hole and the third via hole along the first direction is a fifth distance, and the fifth distance is less than the first distance;

the second distance is less than the fifth distance.

11. The display substrate according to claim 7, further comprising:
a plurality of data lines, extending along the second direction, the plurality of data lines being located at a side of the planarization layer away from the second electrode of the organic light emitting element,
wherein a first center line, extending along the second direction, in the light emitting region of each first color sub-pixel is overlapped with the plurality of data lines in a direction perpendicular to the base substrate.

12. The display substrate according to claim 11, further comprising:
a plurality of power signal lines, extending along the second direction, the plurality of power signal lines and the plurality of data lines being arranged alternately in a same layer,
wherein an orthographic projection of a second center line extending along the second direction in the light emitting regions of the second color sub-pixel pair on the base substrate is located between an orthographic projection of the power signal line connected with the second color sub-pixel pair on the base substrate and an orthographic projection of the data line connected with the first color sub-pixel adjacent to the second color sub-pixel pair on the base substrate.

13. The display substrate according to claim 12, wherein, in the direction perpendicular to the base substrate, a third center line extending along the second direction in the light emitting region of the third color sub-pixel is overlapped with the power signal line.

14. The display substrate according to claim 12, further comprising:
a plurality of scan signal lines, extending along the first direction, and located at a side of a film layer where the plurality of data lines are located facing the base substrate;
a plurality of reset power signal lines, extending along the first direction, and located between a film layer where the plurality of scan signal lines are located and the film layer where the plurality of data lines are located;
a plurality of reset control signal lines, extending along the first direction, and arranged in the same layer as the plurality of scan signal lines; and
a plurality of light emitting control signal lines, extending along the first direction, and arranged in the same layer as the plurality of scan signal lines,
wherein the light emitting control transistor comprises a first light emitting control transistor and a second light emitting control transistor, and the pixel circuit of each sub-pixel further comprises a driving transistor, a data writing transistor, a storage capacitor, a threshold compensation transistor, a first reset transistor and a second reset transistor,
a first electrode of the data writing transistor is electrically connected with a first electrode of the driving transistor, a second electrode of the data writing transistor is electrically connected with the data line to receive a data signal, and a gate electrode of the data writing transistor is electrically connected with the scan signal line to receive a scan signal;
a first electrode of the storage capacitor is electrically connected with the power signal line, and a second electrode of the storage capacitor is electrically connected with a gate electrode of the driving transistor;
a first electrode of the threshold compensation transistor is electrically connected with a second electrode of the driving transistor, a second electrode of the threshold compensation transistor is electrically connected with the gate electrode of the driving transistor, and a gate electrode of the threshold compensation transistor is electrically connected with the scan signal line to receive a compensation control signal;
a first electrode of the first reset transistor is electrically connected with the reset power signal line to receive a first reset signal, a second electrode of the first reset transistor is electrically connected with the gate electrode of the driving transistor, and a gate electrode of the first reset transistor is electrically connected with the reset control signal line to receive a first sub-reset control signal;
a first electrode of the second reset transistor is electrically connected with the reset power signal line to receive a second reset signal, a second electrode of the second reset transistor is electrically connected with the second electrode of the organic light emitting element, and a gate electrode of the second reset transistor is electrically connected with the reset control signal line to receive a second sub-reset control signal;
a first electrode of the first light emitting control transistor is electrically connected with the power signal line, a second electrode of the first light emitting control transistor is electrically connected with the first electrode of the driving transistor, and a gate electrode of the first light emitting control transistor is electrically connected with the light emitting control signal line to receive a first light emitting control signal; and
a first electrode of the second light emitting control transistor is electrically connected with the second electrode of the driving transistor, a second electrode of the second light emitting control transistor is electrically connected with the second electrode of the organic light emitting element, and a gate electrode of the second light emitting control transistor is electrically connected with the light emitting control signal line to receive a second light emitting control signal;
wherein the display substrate further comprises a first connection portion, a second connection portion and a third connection portion which are arranged in the same layer as the plurality of data lines, the first connection portion is configured to connect the second electrode of the threshold compensation transistor and the gate electrode of the driving transistor, the second connection portion is configured to connect the reset power signal line and the first electrode of the second reset transistor, and the third connection portion is configured to connect the second electrode of the organic light emitting element and the second electrode of the second light emitting control transistor.

15. The display substrate according to claim 6, wherein, in each of the plurality of repeating units, the first via hole is located at a side of the light emitting region of the first color sub-pixel close to the second color sub-pixel pair;

in each of the plurality of repeating units, the third via hole is located at a side of the light emitting region of the third color sub-pixel close to the second color sub-pixel pair.

16. A display device, comprising the display substrate according to claim 1.

17. A display substrate, comprising:
a base substrate;
a plurality of repeating units on the base substrate, each of the plurality of repeating units comprising one first color sub-pixel, one second color sub-pixel pair and one third color sub-pixel which are sequentially arranged along a first direction, the second color sub-pixel pair comprising two second color sub-pixels which are arranged along a second direction, the plurality of repeating units being arranged along the first direction to form a plurality of repeating unit groups, the plurality of repeating unit groups being arranged along the second direction, and adjacent repeating unit groups among the plurality of repeating unit groups being shifted from each other along the first direction;
wherein each sub-pixel comprises an organic light emitting element and a pixel circuit for driving the organic light emitting element, the organic light emitting element comprises a first electrode, a light emitting layer and a second electrode which are stacked in sequence, the first electrode of the organic light emitting element is located at a side of the second electrode of the organic light emitting element away from the base substrate;
the display substrate comprises an active semiconductor layer, the active semiconductor layer comprises channel regions and source-drain doped regions of transistors in the pixel circuit of each sub-pixel, the channel regions and the source-drain doped regions of the transistors in a same pixel circuit are integrated, and the pixel circuit comprises a driving transistor, a data writing transistor, a storage capacitor, a threshold compensation transistor, a first reset transistor, a second reset transistor, a first light emitting control transistor and a second light emitting control transistor;
the display substrate further comprises a first conductive layer located at a side of the active semiconductor layer away from the base substrate and a gate insulating layer located between the active semiconductor layer and the first conductive layer, the first conductive layer comprises a second electrode of the storage capacitor, a scan signal line extending along the first direction, a reset control signal line extending along the first direction, a light emitting control signal line extending along the first direction, a gate electrode of the driving transistor, a gate electrode of the data writing transistor, a gate electrode of the threshold compensation transistor, a gate electrode of the first light emitting control transistor, a gate electrode of the second light emitting control transistor, a gate electrode of the first reset transistor and a gate electrode of the second reset transistor, and the gate electrode of the driving transistor is also used as the second electrode of the storage capacitor;

the display substrate further comprises a second conductive layer located at a side of the first conductive layer away from the gate insulating layer, and a first insulating layer located between the second conductive layer and the first conductive layer, and the second conductive layer comprises a reset power signal line extending along the first direction and a first electrode of the storage capacitor;

the display substrate further comprises a source-drain metal layer located at a side of the second conductive layer away from the first insulating layer, and a second insulating layer between the source-drain metal layer and the second conductive layer, and the source-drain metal layer comprises a power signal line extending along the second direction, a data line extending along the second direction, a first connection portion, a second connection portion and a third connection portion;

wherein a first electrode of the data writing transistor is electrically connected with a first electrode of the driving transistor, a second electrode of the data writing transistor is electrically connected with the data line to receive a data signal, and the gate electrode of the data writing transistor is electrically connected with the scan signal line to receive a scan signal;

the first electrode of the storage capacitor is electrically connected with the power signal line, and the second electrode of the storage capacitor is electrically connected with the gate electrode of the driving transistor;

a first electrode of the threshold compensation transistor is electrically connected with a second electrode of the driving transistor, a second electrode of the threshold compensation transistor is electrically connected with the gate electrode of the driving transistor, and the gate electrode of the threshold compensation transistor is electrically connected with the scan signal line to receive a compensation control signal;

a first electrode of the first reset transistor is electrically connected with the reset power signal line to receive a first reset signal, a second electrode of the first reset transistor is electrically connected with the gate electrode of the driving transistor, and the gate electrode of the first reset transistor is electrically connected with the reset control signal line to receive a first sub-reset control signal;

a first electrode of the second reset transistor is electrically connected with the reset power signal line to receive a second reset signal, a second electrode of the second reset transistor is electrically connected with the second electrode of the organic light emitting element, and the gate electrode of the second reset transistor is electrically connected with the reset control signal line to receive a second sub-reset control signal;

a first electrode of the first light emitting control transistor is electrically connected with the power signal line, a second electrode of the first light emitting control transistor is electrically connected with the first electrode of the driving transistor, and the gate electrode of the first light emitting control transistor is electrically connected with the light emitting control signal line to receive a first light emitting control signal;

a first electrode of the second light emitting control transistor is electrically connected with the second electrode of the driving transistor, a second electrode of the second light emitting control transistor is electrically connected with the second electrode of the organic light emitting element, and the gate electrode of the second light emitting control transistor is electrically connected with the light emitting control signal line to receive a second light emitting control signal;

the first connection portion is configured to connect the second electrode of the threshold compensation transistor and the gate of the driving transistor, the second connection portion is configured to connect the reset power signal line and the first electrode of the second reset transistor, and the third connection portion is configured to connect the second electrode of the organic light emitting element and the second electrode of the second light emitting control transistor;

the third connection portion comprises a first part and a second part, the first part of the third connection portion is electrically connected with the second electrode of the second light emitting control transistor through a fourth via hole penetrating through the gate insulating layer, the first insulating layer and the second insulating layer, and the second part of the third connection portion is electrically connected with the second electrode of the organic light emitting element through a via hole penetrating through the planarization layer;

wherein, in a direction perpendicular to the base substrate, the second electrode of the organic light emitting element of the first color sub-pixel is overlapped with the power signal line, the data line and the third connection portion, and a first center line extending along the second direction in a light emitting region of the first color sub-pixel is overlapped with the data line, and the power signal line and the third connection portion are located at both sides of the data line.

18. The display substrate according to claim 17, wherein, in a same repeating unit, the fourth via hole of the first color sub-pixel, the fourth via hole of the third color sub-pixel and the fourth via hole of one second color sub-pixel are located on a straight line extending along the first direction and are arranged at equal intervals;

three fourth via holes in the first repeating unit, three fourth via holes in the second repeating unit and one fourth via hole of one second color sub-pixel in the third repeating unit are located on a straight line extending along the first direction and are arranged at equal intervals.

19. The display substrate according to claim 18, wherein, in the first color sub-pixel, the second electrode of the organic light emitting element is connected with the second light emitting control transistor through a first via hole located in the planarization layer; in the second color sub-pixel pair, two second electrodes of organic light emitting elements of two second color sub-pixels are respectively connected with two second light emitting control transistors through two second via holes located in the planarization layer; in the third color sub-pixel, the second electrode of the organic light emitting element is connected with the second light emitting control transistor through a third via hole located in the planarization layer, the fourth via hole of the second color sub-pixel is not overlapped with the light emitting region of the second color sub-pixel, the fourth via hole of the second color sub-pixel is located at a side of the second via hole of the second color sub-pixel close to the first via hole of the first color sub-pixel, orthogonal projections of the fourth via hole of the second color sub-pixel and the second via hole of the second color sub-pixel on a straight line extending along the second direction are overlapped, and a straight line extending along the first direction passes through the fourth via hole of the second color sub-pixel and the second via hole of the second color sub-pixel.

20. The display substrate according to claim 17, wherein, in the direction perpendicular to the base substrate, one of two second electrodes of the organic light emitting elements included in the second color sub-pixel pair is overlapped with the data line, the power signal line, the second connection portion and the third connection portion, and a second center line extending along the second direction in light emitting regions of the second color sub-pixel pair is overlapped with the third connection portion, the second connection portion and the power signal line are located at one side of the second center line, and the data line is located at the other side of the second center line; and in the direction perpendicular to the base substrate, the other of the two second electrodes of the organic light emitting elements included in the second color sub-pixel pair is overlapped with the data line, the power signal line, and the first connection portion and the third connection portion, the second center line is overlapped with the third connection portion, the first connection portion and the power signal line are located at one side of the second center line, and the data line is located at the other side of the second center line;

in the direction perpendicular to the base substrate, the second electrode of the organic light emitting element of the third color sub-pixel is overlapped with the data line, the power signal line, the first connection portion, the second connection portion and the third connection portion; and a third center line extending along the second direction in a light emitting region of the third color sub-pixel is overlapped with the power signal line, the data line is located at one side of the third center line, and the first connection portion, the second connection portion and the third connection portion are located at the other side of the third center line.

* * * * *

UNITED STATES PATENT AND TRADEMARK OFFICE
CERTIFICATE OF CORRECTION

PATENT NO. : 12,238,997 B2
APPLICATION NO. : 17/435221
DATED : February 25, 2025
INVENTOR(S) : Tinghua Shang et al.

It is certified that error appears in the above-identified patent and that said Letters Patent is hereby corrected as shown below:

In the Claims

In Claim 10 Line 14 (Column 47, Line 14): please change "according to claim 8" to correctly read:
-- according to claim 7 --

Signed and Sealed this
Third Day of June, 2025

Coke Morgan Stewart
*Acting Director of the United States Patent and Trademark Office*